(12) United States Patent
Ledezma et al.

(10) Patent No.: US 10,537,046 B1
(45) Date of Patent: Jan. 14, 2020

(54) COOLING METHODS FOR MEDIUM VOLTAGE DRIVE SYSTEMS

(71) Applicant: TECO-Westinghouse Motor Company, Round Rock, TX (US)

(72) Inventors: Enrique Ledezma, Austin, TX (US); Bhaskara Palle, Round Rock, TX (US); Rose Metzler, Cedar Park, TX (US)

(73) Assignee: TECO-WESTINGHOUSE MOTOR COMPANY, Round Rock, TX (US)

( * ) Notice: Subject to any disclaimer, the term of this patent is extended or adjusted under 35 U.S.C. 154(b) by 0 days.

(21) Appl. No.: 16/205,840

(22) Filed: Nov. 30, 2018

(51) Int. Cl.
*H05K 7/20* (2006.01)
*H02B 1/56* (2006.01)
*H02P 27/08* (2006.01)
*H02M 5/458* (2006.01)
*H02M 7/00* (2006.01)

(52) U.S. Cl.
CPC ...... *H05K 7/20927* (2013.01); *H02M 5/4585* (2013.01); *H02M 7/003* (2013.01); *H02P 27/08* (2013.01); *H05K 7/20154* (2013.01); *H05K 7/20936* (2013.01); *H02B 1/565* (2013.01); *H05K 7/202* (2013.01); *H05K 7/20254* (2013.01); *H05K 7/20572* (2013.01); *H05K 7/20609* (2013.01)

(58) Field of Classification Search
CPC ............... H05K 7/202; H05K 7/20218; H05K 7/20254; H05K 7/20572; H05K 7/20609; H05K 7/20645; H05K 7/20927; H05K 7/20154; H05K 7/20918; H05K 7/20172; H02P 27/08; H02M 5/4585; H02M 7/003; H02B 1/56; H02B 1/565

USPC ...... 361/679.46–679.54, 688–723, 600–678; 165/80.4–80.5, 104.33
See application file for complete search history.

(56) References Cited

U.S. PATENT DOCUMENTS 3,659,239 A * 4/1972 Marton ............... H01F 27/22
 336/57
6,563,410 B1 * 5/2003 Marton ............... H01F 27/10
 336/55
7,863,766 B2 1/2011 Abolhassani
 (Continued)

OTHER PUBLICATIONS

Bhattacharya, et al., "Design and Development of Generation-I Silicon based Solid State Transformer," IEEE APEC 2010 25th Annual Conference, 2010, pp. 1666-1673.
(Continued)

*Primary Examiner* — Zachary Pape
(74) *Attorney, Agent, or Firm* — Trop, Pruner & Hu, P.C.

(57) ABSTRACT

In one aspect, a medium voltage power converter includes a cabinet having: a power cube bay to house a plurality of power cubes, each of the plurality of power cubes adapted within a corresponding enclosure and comprising a low frequency front end stage, a DC link and a high frequency back end stage, the plurality of power cubes to couple to a high speed machine; and a plurality of first barriers adapted to isolate and direct a first flow of cooling air through one of the plurality of power cubes; and a transformer bay having at least one transformer to couple between a utility connection and the plurality of power cubes, the transformer bay including a plurality of cooling fans to cool the at least one transformer.

20 Claims, 18 Drawing Sheets

(56) References Cited

U.S. PATENT DOCUMENTS

| | | | |
|---|---|---|---|
| 8,254,076 B2 * | 8/2012 | Ledezma | H02P 27/14 |
| | | | 361/118 |
| 8,575,479 B2 | 11/2013 | Abolhassani | |
| 8,644,037 B2 | 2/2014 | Raju et al. | |
| 8,976,526 B2 * | 3/2015 | Kulkarni | H02M 7/003 |
| | | | 307/10.6 |
| 9,153,374 B2 * | 10/2015 | Kulkarni | H05K 7/1432 |
| 10,130,016 B2 | 11/2018 | Ledezma | |
| 2019/0246527 A1 * | 8/2019 | Ionescu | H05K 7/20145 |

OTHER PUBLICATIONS

Madhusoodhanan, et al., "Solid-State Transformer and MV Grid Tie Applications Enabled by 15 kV SiC IGBTs and 10kV SiC MOSFETS Based Multilevel Converters," IEEE Transactions on Industry Applications, vol. 51, No. 4, Jul./Aug. 2015, pp. 1-18.

Kheraluwala, et al., "Performance Characterization of a High-Power Dual Active Bridge DC-to-DC Converter," IEEE Trans. Ind. Appl., vol. 28, No. 6, Nov./Dec. 1992, pp. 1294-1301.

Giri et al., "Input-Series and Output-Series Connected Modular DC-DC Converter With Active Input Voltage and Output Voltage Sharing," IEEE APEC '04, vol. 3, 2004, pp. 1751-1756.

Choudhary, et al., "Fault Tolerant and Control Method for Input-Series and Output-Parallel Modular DC-DC Converters," IEEE Trans. on Ind. Appl., vol. 23, No. 1, 2008, pp. 402-411.

Falcones, et al., "Topology Comparison for Solid State Transformer Implementation," IEEE 2010 PES General Meeting, Jul. 2010, pp. 1-8.

Yaskawa Electronic Corporation, "Super Energy-Saving Medium-Voltage Matrix Converter With Power Regeneration, FSDrive-MX1S, 3 kV 200 to 300 kVA, 6kV 400 to 6000 kVA," Drives and Motion Division, 2010, pp. 1-16.

U.S. Appl. No. 16/205,879, filed Nov. 30, 2018, entitled "High Frequency Medium Voltage Drive System for High Speed Machine Applications" by Enrique Ledezma, et al.

\* cited by examiner

Hybrid SiC Power Cube

Full SiC Power Cube

COOLING METHODS FOR MEDIUM VOLTAGE DRIVE SYSTEMS

This invention was made with government support under Grant No. DE-EE0007254 awarded by the Department of Energy. The government has certain rights in the invention.

BACKGROUND

Typical medium voltage (MV) power converters or so-called drive systems are formed of silicon-based topologies. Such systems do not meet advanced requirements being demanded by various industries to improve overall system performance and cost. Specific system challenges include higher fundamental frequency operation than currently available, e.g., up to 1000 Hertz (Hz) for direct drive applications, high performance MV drives to handle power demand within a medium power range (e.g., up to 20 megawatts (MW)), overall converter system efficiencies better than 97%, and reduced volumetric power density and footprint to improve system power density and cost. Current systems are not capable of such operation.

Rather, traditional multi-megawatt and multi-level medium voltage power converter technology based on silicon devices operate within the range of 0-120 Hz of fundamental frequency, 600 Hz switching, and efficiencies up to 95%. Operation at higher fundamental frequencies is prohibited due to high switching loss causing stiff system de-rating, dramatic system efficiency and power density reductions.

SUMMARY OF THE INVENTION

In one aspect, a medium voltage power converter includes a plurality of slices each having: a transformer including a plurality of primary windings to couple to a utility source of input power and a plurality of secondary windings; and a plurality of power cubes coupled to the plurality of secondary windings, each of the plurality of power cubes comprising a low frequency front end stage, a DC link, and a high frequency silicon carbide (SiC) inverter stage to couple to a high frequency load or to a high speed machine.

In an embodiment, the medium voltage power converter further comprises one or more sensors coupled to an input of the medium voltage power converter to obtain sensor information. The medium voltage power converter may further comprise a circuit breaker coupled between the utility source of input power and the medium voltage power converter. The circuit breaker may dynamically connect or disconnect the medium voltage power converter from the utility source of input power based at least in part on the sensor information. The medium voltage power converter may further include a grid interface controller to store and provide support functions to the high speed machine, a high speed mechanical load, and a utility grid system. The high frequency load may be a high speed machine to operate at a frequency between 500-1000 Hertz, where the utility source of input power is to operate at a frequency of 50/60 Hertz. The low frequency front end stage may be a SiC-based active front end stage. Each of the plurality of power cubes comprises an enclosure having a plurality of AC bus bars displaced towards a first face of the power cube. A DC bus of the DC link may have a laminated configuration displaced towards a second face of the power cube, the laminated configuration having a first horizontal portion having gate drive openings formed directly there through. The DC bus may further include a second horizontal portion vertically offset from the first horizontal portion. The second horizontal portion may couple to a plurality of capacitors, which may have a capacitance on the order of between approximately 6.5-10.5 millifarads. The first horizontal portion may comprise: a plurality of AC bus clearances via which a plurality of AC bus bars are to couple to at least one SiC device; and a plurality of gate driver interfaces via which interconnects for communication of gate drive signals are adapted.

In another aspect, a medium voltage power converter includes: a plurality of slices each having a transformer including a plurality of primary windings to couple to a point of common coupling of a utility at a first frequency and a plurality of secondary windings each to couple to one of a plurality of power cubes of the slice, each of the plurality of power cubes comprising an insulated gate bipolar transistor (IGBT) active front end stage, a DC link, and a SiC back end stage to couple to a load at a second frequency, the second frequency greater than the first frequency.

In an embodiment, when the load is a source of power, the SiC back end stage is to operate as a rectifier and the IGBT active front end stage is to operate as an inverter, to enable generated power to be provided to the utility via the point of common coupling. The medium voltage power converter may further include a controller to cause the SiC back end stage to operate as the inverter and the IGBT active front end stage to operate as the rectifier when the utility is the source of power.

In another aspect, a transformer for a medium voltage power converter comprises: a plurality of core legs adapted between a first column and a second column, each of the plurality of core legs having: a set of primary windings adapted around the corresponding core leg; and a set of secondary windings adapted around the set of primary windings.

In an embodiment, each of the plurality of core legs is associated with a phase of three-phase power. The set of primary windings for a first core leg may be connected in parallel. In an embodiment, each of a first set of secondary windings adapted around the set of primary windings adapted around a first core leg is coupled to one of a first power cube, the first power cube comprising a low frequency front end stage, a DC link, and a high frequency back end stage, a second power cube comprising a low frequency front end stage, a DC link, and a high frequency back end stage and a third power cube comprising a low frequency front end stage, a DC link, and a high frequency back end stage; each of a second set of secondary windings adapted around the set of primary windings adapted around a second core leg is coupled one of the first power cube, the second power cube and the third power cube; and each of a third set of secondary windings adapted around the set of primary windings adapted around a third core leg is coupled to one of the first power cube, the second power cube and the third power cube.

In an embodiment, the plurality of secondary windings provides a balanced impedance to the plurality of power cubes. Each of the set of primary windings may be spaced from another of the set of primary windings by a first separation distance of at least two inches to provide decoupling from each other. The plurality of secondary windings provides an amount of the balanced impedance to the plurality of power cubes to ensure control stability. Each of the set of primary windings may be spaced from the set of secondary windings by a second separation distance of at least a half inch.

In another aspect, a medium voltage power converter includes a cabinet having: a power cube bay to house a plurality of power cubes, each of the plurality of power cubes adapted within a corresponding enclosure and comprising a low frequency front end stage, a DC link and a high frequency back end stage, the plurality of power cubes to couple to a high speed machine; and a plurality of first barriers adapted to isolate and direct a first flow of cooling air through one of the plurality of power cubes; and a transformer bay having at least one transformer to couple between a utility connection and the plurality of power cubes, the transformer bay including a plurality of cooling fans to cool the at least one transformer.

In an embodiment, the cabinet includes at least one first opening to divert the first flow of cooling air from the transformer bay to the power cube bay and at least one second opening to direct a flow of air exiting the plurality of power cubes from the power cube bay to the transformer bay. The plurality of cooling fans may exhaust the exiting flow of air. The cabinet may include a permeable member to enable a second flow of cooling air from an ambient environment to be directed through the at least one transformer via the plurality of cooling fans. The cabinet may be implemented as a sealed enclosure. In an example, the transformer bay is to be air cooled and the power cube bay is to be liquid cooled. The power cube bay may be isolated from the transformer bay.

In an embodiment, the power cube bay includes: a heat exchanger to remove heat from the first flow of cooling air; a first opening to enable the first flow of cooling air to be directed through the plurality of power cubes; and a second opening to direct a flow of heated air from the plurality of power cubes to the heat exchanger.

In another aspect, a system includes one or more medium voltage power converters, each of which may include a first cabinet having: a power cube bay to house a plurality of power cubes, each of the plurality of power cubes adapted within a corresponding enclosure and comprising a low frequency front end stage, a DC link and a high frequency back end stage, the plurality of power cubes to couple to a high speed machine; a transformer bay having at least one transformer to couple between a utility connection and the plurality of power cubes. The transformer bay may include a plurality of cooling fans to cool the at least one transformer. The at least one transformer may include: a plurality of core legs adapted between a first column and a second column, where: a first core leg has a first plurality of cold plates adapted there about, a first set of primary windings adapted around the first plurality of cold plates, and a first set of secondary windings adapted around the first set of primary windings; a second core leg has a second plurality of cold plates adapted there about, a second set of primary windings adapted around the second plurality of cold plates, and a second set of secondary windings adapted around the second set of primary windings; a third core leg has a third plurality of cold plates adapted there about, a third set of primary windings adapted around the third plurality of cold plates, and a third set of secondary windings adapted around the third set of primary windings.

In an embodiment, the system further includes: a first cold plate adapted about at least a portion of the first column; and a second cold plate adapted about at least a portion of the second column. The first cabinet may be sealed with regard to an ambient environment, where at least one first opening is provided between the transformer bay and the power cube bay to provide a first flow of cooling air from the transformer bay to the power cube bay and at least one second opening is provided between the transformer bay and the power cube bay to provide a flow of exhaust air from the power cube bay to the transformer bay.

In an example, the system further comprises a plurality of first barriers adapted to isolate and direct a first flow of cooling air through one of the plurality of power cubes. The system may further include a first two-phase cooling system to cool the at least one transformer via the first, second and third plurality of cold plates, and a second two-phase cooling system to cool at least the low frequency front end stage and the high frequency back end stage of the plurality of power cubes.

In another embodiment, an apparatus includes a cabinet having a medium voltage power converter. The cabinet may include: a power cube bay to house a plurality of power cubes, each of the plurality of power cubes adapted within a corresponding enclosure and comprising a front end stage, a DC link and a back end stage; a plurality of first barriers adapted to isolate and direct a flow of cooling air through one of the plurality of power cubes; and a transformer bay having at least one transformer to couple between a utility connection and the plurality of power cubes. The transformer bay may include: a plurality of cooling fans to direct the flow of cooling air, the cabinet including at least one first opening to direct the flow of cooling air from the transformer bay to the power cube bay and at least one second opening to direct a flow of air exiting the plurality of power cubes from the power cube bay to the transformer bay.

In an embodiment, the apparatus further includes: a first plurality of cold plates adapted around a first core leg of the at least one transformer, and interposed between the first core leg and a first set of primary windings adapted around the first core leg; a second plurality of cold plates adapted around a second core leg of the at least one transformer, and interposed between the second core leg and a second set of primary windings adapted around the second core leg; and a third plurality of cold plates adapted around a third core leg of the at least one transformer, and interposed between the third core leg and a third set of primary windings adapted around the third core leg.

In an embodiment, the apparatus may further include: a first cold plate adapted about at least a portion of a first column of the at least one transformer; and a second cold plate adapted about at least a portion of a second column of the at least one transformer. The apparatus may further comprise a first two-phase cooling system to cool the at least one transformer via the first, second and third plurality of cold plates and a second two-phase cooling system to cool at least the plurality of power cubes. The cabinet may be a sealed enclosure. The apparatus may further include a plurality of reactors adapted within the transformer bay, each of the plurality of reactors coupled between the at least one transformer and a corresponding one of the plurality of power cubes.

DETAILED DESCRIPTION

In various embodiments, a high speed and frequency modular medium voltage drive system can be realized with a wide-band-gap (WBG)-based medium voltage (MV) power converter. Such power converter enables high speed machine drive systems. In some systems, a WBG-based MV power converter and a high speed induction machine can couple together to provide bidirectional power transfer capability. The power transfer occurs between a utility grid and a mechanical load. In other embodiments, the power converter system can be connected to an electrical or other high speed load that can act as a source, so that the system can transfer collected energy to a utility distribution power grid at a proper voltage and current.

The system construction can be based on full WBG devices such as silicon carbide (SiC) metal oxide semiconductor field effect transistors (MOSFETs) for high efficiency systems, or insulated gate bipolar transistor (IGBT)-based systems for low cost applications where system de-rating is permitted and minimum system power density and footprint are not restrictive. In another embodiment, a hybrid power topology (e.g., IGBT and SiC power MOSFET combinations) can be used for ease of electrical switching requirements or for low cost considerations while maintaining acceptable overall system performance.

Figure 1:
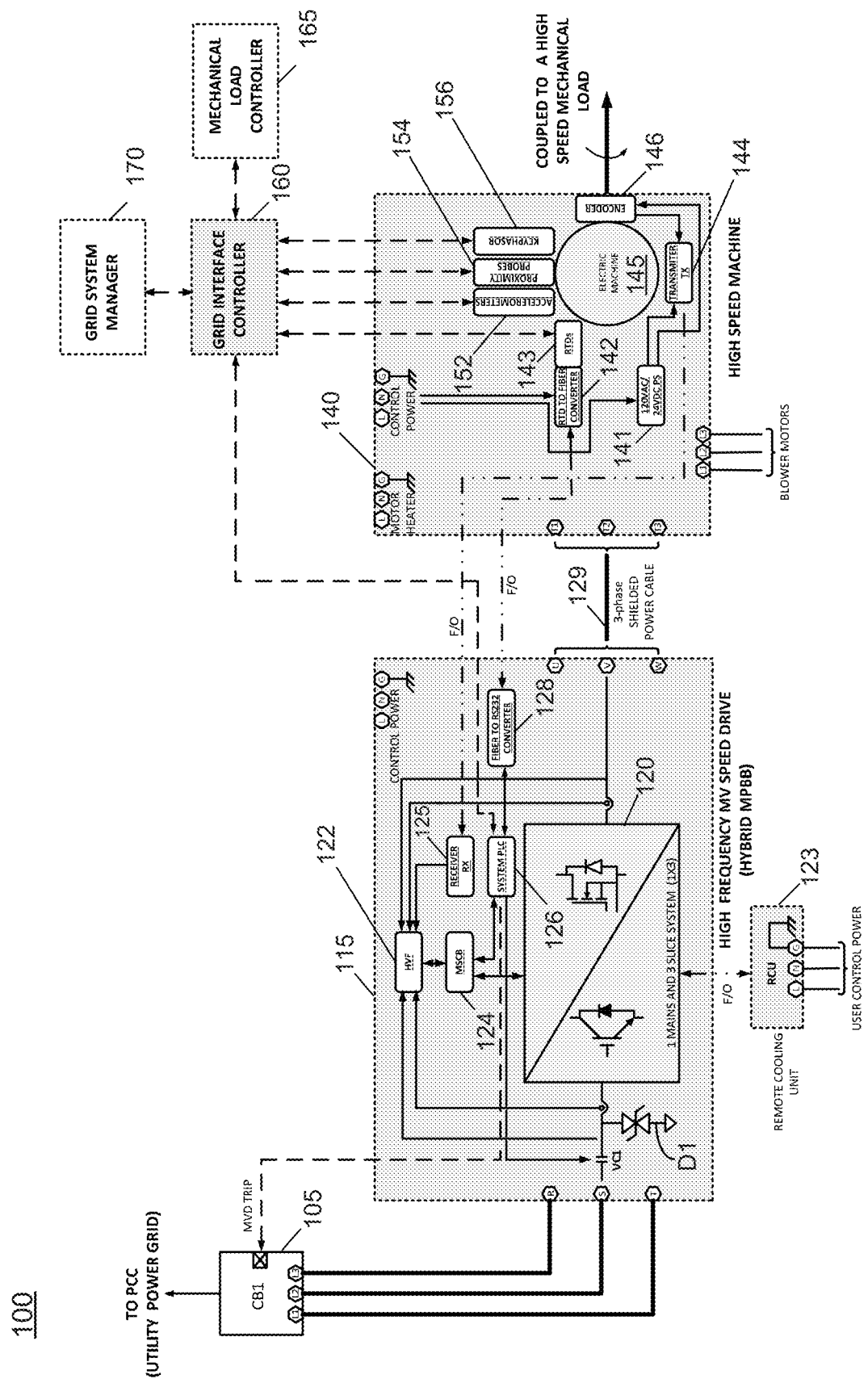
FIG. 1 is a schematic diagram of a high speed power conversion environment in accordance with an embodiment of the present invention.

Referring now to FIG. 1, shown is a schematic diagram of a power conversion environment in accordance with an embodiment of the present invention. More specifically as shown in FIG. 1, power conversion environment 100 is implemented with a high speed and frequency modular medium voltage drive system with a hybrid converter configuration as previously described. In the embodiment shown in FIG. 1, a drive system 115 is coupled via a point of common coupling (PCC) connection to a utility distribution power grid (which may operate at a frequency of 50 or 60 Hz, depending on country) through a circuit breaker system 105. In turn, drive system 115 couples to a high speed machine 140 that in turn may couple to a high speed mechanical load, as an example.

Drive system 115 may be implemented in one or more cabinets. In an embodiment, drive system 115 may be implemented as a 1.8-2.3 MVA high frequency variable speed drive having a nominal voltage of 4160 volts (V), and operable at between 500-1000 Hertz (Hz). As illustrated, drive system 115 may include a multi-slice arrangement with a single mains controller where a converter system controller resides and 3 slices implemented as a subsystem 120. In the high level view of FIG. 1, note that subsystem 120 is formed of slices including hybrid technology, namely front ends formed of IGBTs and back ends formed of SiCs, resulting in a hybrid topology. As used herein, the term "slice" is used to refer to a portion of a power conversion system including at least one transformer and multiple so-called power cubes that include semiconductor switching devices. A slice-based system thus couples between a grid connection, and which may operate at a first, low frequency and a load connection, which may operate at a second, high frequency. And as described herein, depending upon given system implementation and control configuration, the direction of power flow through a slice may be bi-directional. Note as used herein, the term "low frequency" is intended to refer to a frequency of a utility, generally less than 100 Hz, and more particularly 50 or 60 Hz. And as used herein, the term "high frequency" is intended to refer to operation at a frequency substantially greater than the utility frequency. For example, representative use cases of a power converter as herein may couple to high frequency loads of between approximately 500 Hz-1000 Hz.

While shown with a hybrid topology in FIG. 1, understand that in other implementations, a full WBG-based topology may exist. With associated electronics, this arrangement of drive system 115 is also referred to herein as a modular power building block (MPBB). Details of a given MPBB and slice will be described further below. As seen, subsystem 120 couples between an input from the utility distribution power grid via a vacuum contactor VC1 and a transient-voltage-suppression (TVS) protection D1. In turn, an output of subsystem 120 couples via a 3-phase single shielded power cable 129 to another enclosure 140, which houses an electric machine 145.

With reference to the further details shown in the illustration of FIG. 1, drive system 115 further includes a remote cooling unit 123 coupled to subsystem 120 via fiber optic link. In addition, a high voltage feedback board (HVF) 122 couples between the input to subsystem 120 and its output. HVF 122 further couples to a main system control board (MSCB) 124 that in turn couples to a system programmable logic controller (PLC) 126. As illustrated, system PLC 126 further couples to a fiber-to-RS232 converter 128 to provide a fiber optic interface. In addition, HVF 122 couples to a receiver 125. Communications blocks 128 and 125 provide a fiber optic implementation to minimize latency and noise impact on local command communication signals between variable frequency speed drive system 115 and high speed machine 140. System controller MSCB 124 processes control signal received from HVF 122, system PLC 126, and receiver 125. System controller MSCB 124 transmits produced actions via system PLC 126 to the rest of the system and voltage command references to subsystem 120 for space vector pulse width modulation (SVPWM) and spread carrier PWM switch modulation implementations.

Still with reference to FIG. 1, details of high speed machine 140 are also shown. As illustrated, high speed machine 140 may be, in an embodiment, rated at 4160V and 15,000 RPM or other ratings at higher voltage and speed. High speed machine 140 includes an electric machine 145 that receives 3-phase power via a shielded power cable 129. Measurements regarding parameters of electric machine 145 may be made by various components including RTDs 143, which outputs can be sent through a fiber optic link via a RTD-to-fiber converter 142, accelerometers 152, proximity probes 154, and a key phasor 156. As illustrated, these components may be in communication with a controller, namely a grid interface controller 160 that further couples to system PLC 126 of drive system 115 via fiber optic interfaces. In a preferred embodiment, grid interface controller 160 resides within MPBB 115 and provides advanced support functions to high speed machine 140, a high speed mechanical load controller 165, and a grid system manager 170. Furthermore, grid interface controller 160 provides local smart capability by storing and processing interconnectivity information, e.g., advanced support function algorithms.

As further seen, high speed machine 140 also includes a power supply 141 which may be configured as a 120 VAC/24 VDC power supply that in turn powers a transmitter 144 and an encoder 146 that may couple to a mechanical load. Although shown at this high level in the embodiment of FIG. 1, many variations and alternatives are possible.

Figure 2A:
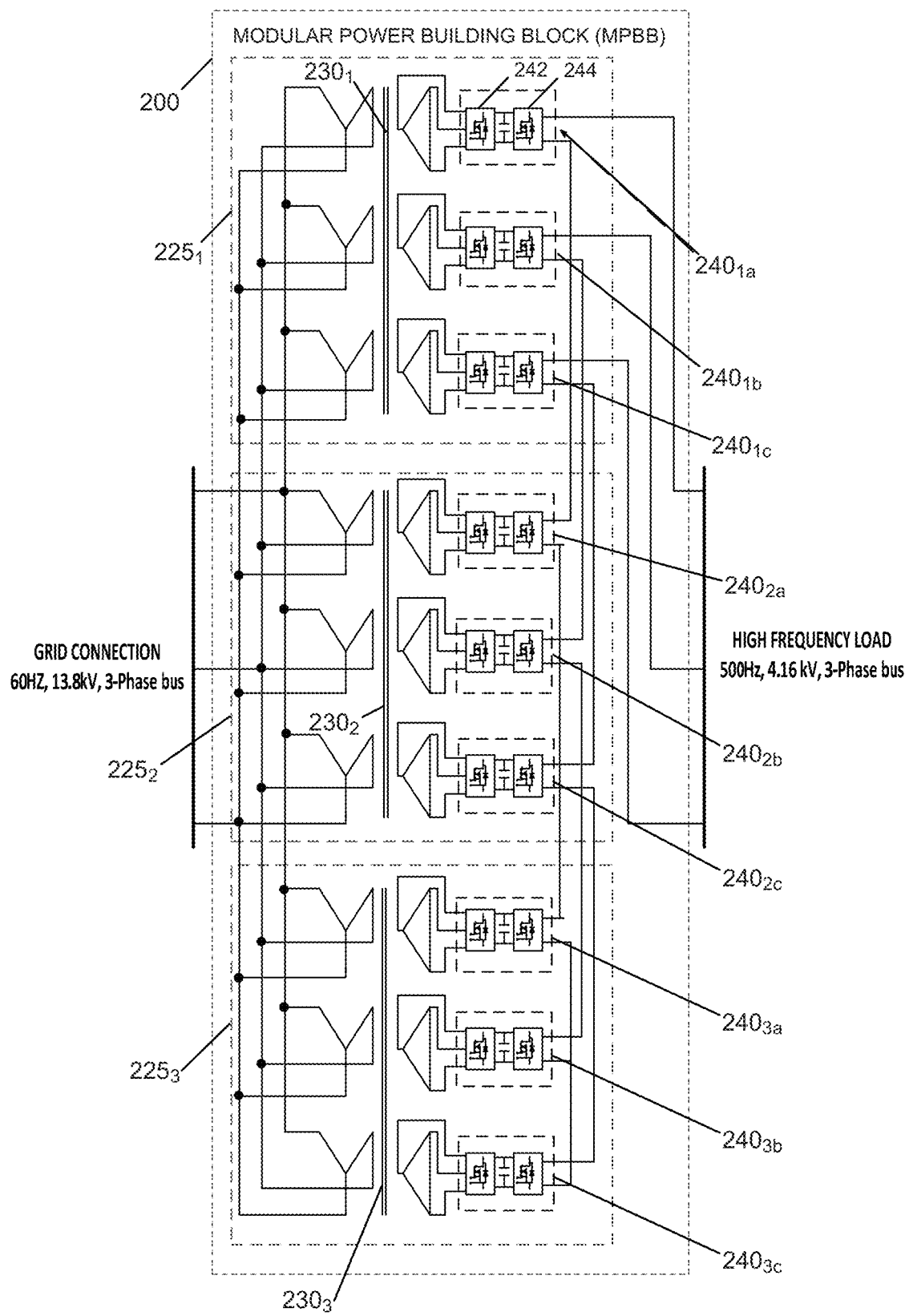
FIG. 2A is a schematic diagram of a representative SiC-based modular power building block in accordance with an embodiment of the present invention.

Referring now to FIG. 2A, shown is a schematic diagram of a representative SiC-based modular power building block (MPBB) 200. In typical implementations, modularity may be provided by a drive system having multiple MPBBs. Yet for ease of illustration, only a single MPBB is shown in FIG. 2A. In embodiments, MPBB 200 may be implemented in one or more modular housings, for example, a number of cabinet enclosures. With reference to MPBB 200, a plurality of slices $225_1$-$225_3$ are present. In an example modular implementation, each slice 225 may be implemented in its own slice cabinet. In addition, although not shown for ease of illustration in FIG. 2, understand that a MPBB may further include another cabinet for housing a mains controller and its associated electronics circuitry, such as illustrated in the high level view of FIG. 1.

As seen, each slice 225 includes a transformer $230_1$-$230_3$. Each transformer is a 3-phase transformer that may have a primary configured in a WYE configuration and a secondary configured in a DELTA configuration. More specifically, each transformer 230 includes a plurality of transformer legs (three legs per transformer), which may be adapted between a pair of columns of the transformer. Each transformer leg has a 3 WYE input winding configuration connected in parallel at the input (WYE equivalent) and a 3 isolated DELTA winding configuration at the output. For the three transformers $230_1$-$230_3$, all 9 WYE primary configurations are connected in parallel at the input (GRID). As illustrated, the secondary windings of transformers 230 in turn couple to corresponding power cubes $240_{A1}$-$240_{C3}$. As used herein, the term "power cube" refers to an electronics module including semiconductor devices that receive switching signals to perform rectification and inversion operations to condition a flow of incoming power, including converting incoming power of a first frequency to outgoing conditioned power of a second frequency. Depending upon direction of power flow, the first frequency may be higher than the second frequency or vice-versa.

Figure 2C:
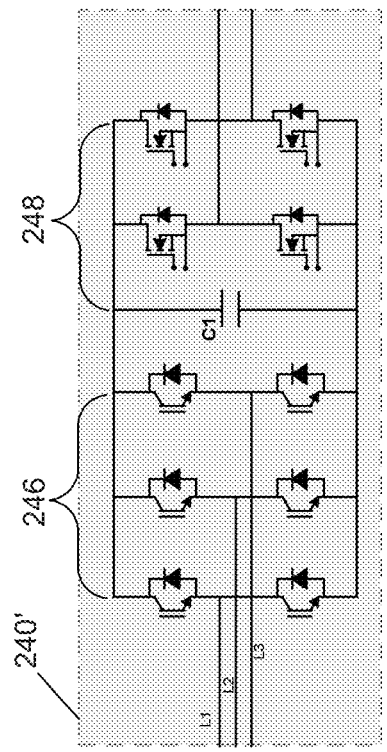
FIG. 2C is a schematic diagram of a power cube in accordance with another embodiment of the present invention.
Figure 2B:
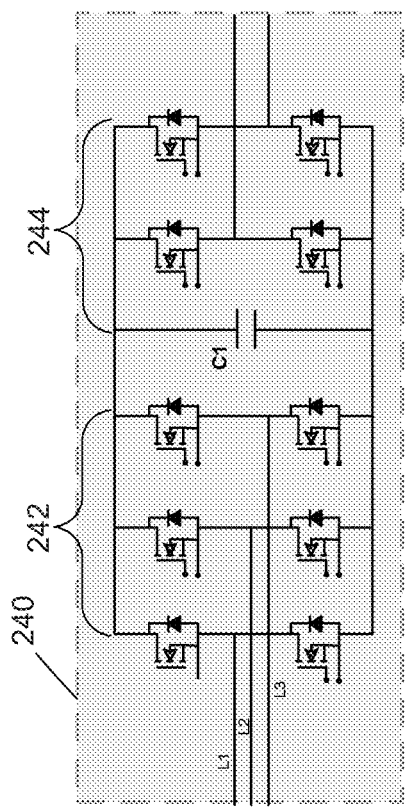
FIG. 2B is a schematic diagram of a power cube in accordance with an embodiment of the present invention.

In the high level view of FIG. 2A and as more particularly shown in the schematic diagram of FIG. 2B in one implementation each of a plurality of power cubes $240_{1,a-c}$-$240_{3,a-c}$ is implemented as a full SiC power cube including an active front end (AFE) converter 242 formed of a plurality of SiC switching devices, a DC bus implemented with a capacitance C1, and an H-bridge converter stage 244 implemented with another plurality of SiC switching devices. Note when the power flows from left to right in the block diagram of FIG. 2B, then component 242 is a rectifier and component 244 an inverter. When the power flows from right to left, then component 242 works as an inverter and component 244 as a rectifier. AFE means that the stage is actively controlled. In this embodiment the switching frequency of the SiC devices is set between 4 and 12 kHz, however other switching frequencies might be used depending on various operational requirements (e.g., 2-phase cold plate thermal capability limit) and desired performance targets (e.g., DC bus regulation control stability). For example, during generation operation mode (from right to left on power cube 240), the commanded active power is taken at the single-phase AC side operated at 740 VAC and processed by power converter stage 244 using a PWM control scheme. This power is transferred via the DC-link capacitor bank C1 regulated at 1000 VDC by power stage 242 using a SVPWM control scheme and deposited at the 3-phase AC side at 600V. The collected system power energy is transferred to the power grid via circuit breaker system 105 commanded by control actions implemented of grid interface controller 160. During motoring operation, active power flows from left to right following the opposite control process described above. During this operation mode, high speed machine system 140 may be controlled using a speed control algorithm implemented on MSCB 124.

In the implementation of FIG. 2C, an alternate embodiment of a power cube is shown in schematic form. Here, power cube 240' is implemented with a hybrid topology having a front end 246 formed of IGBTs, a DC bus represented as a capacitance C1, and a back end stage 248 implemented with SiCs. As with the above discussion, depending upon the direction of power flow, either of front end stage 246 and back end stage 248 may act as an inverter or rectifier. In this embodiment, the front end switching frequency is set between 2 kHz and 6 kHz, and the back end switching frequency is set between 6 kHz and 12 kHz, however other switching frequencies might be used depending on various operational requirements and desired performance targets. The main advantage of the power topology of power cube 240' may be a cost competitive system implementation. Back end stage 248 may utilize SiC-based devices (e.g., 1700V SiC power MOSFETS) and front end stage 246 may be implemented using low cost Si-based devices (e.g., 1700V IGBTs).

Figure 3:
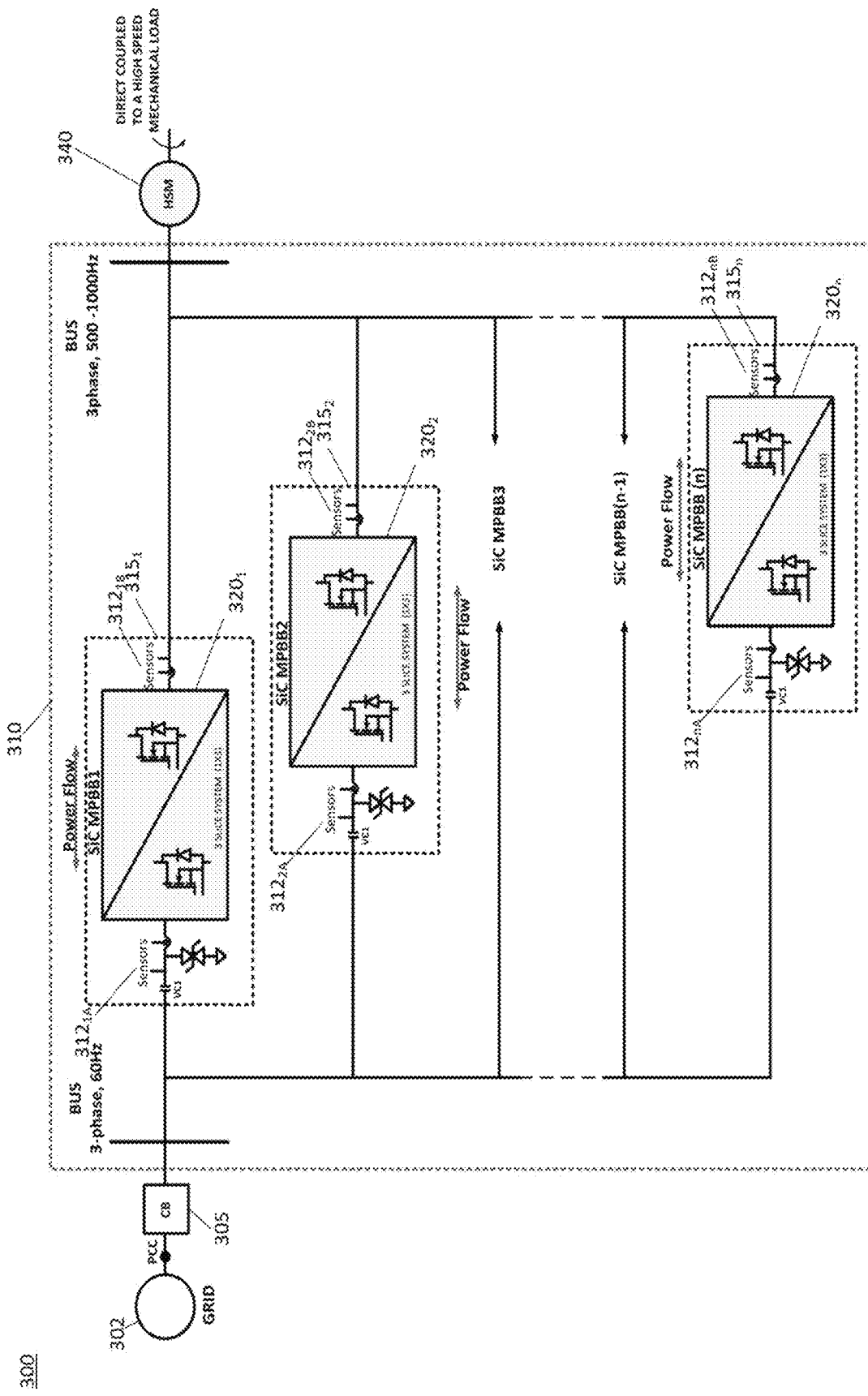
FIG. 3 is a schematic diagram of a modular multi-megawatt power converter system in accordance with another embodiment of the present invention.

Referring now to FIG. 3, shown is a schematic diagram of a system in accordance with another embodiment of the present invention. As shown in FIG. 3, system 300 is implemented as a multi-megawatt scale power converter system 310. More specifically, representative power converter 310 is implemented as a scalable multi-megawatt full SiC-based power converter implemented with a plurality of modular drive enclosures $315_1$-$315_n$, or SiC MPBBs, each including a multi-slice drive system $320_1$-$320_n$. Each MPBB 315 includes a multi-slice drive system 320 and mains cabinet (system controller, output/input sensors, input/output AC connections). The number of MPBBs, that form a given power converter is design specific based on power requirements.

As illustrated, power converter 310 couples to a grid 302 that may supply 3-phase power at 13.8 kilovolts (kV). As seen, power converter 310 couples to grid 302 by way of a PCC. In turn, power converter 310 may couple to various loads, including a high speed electrical machine 340 that can couple to a high speed mechanical load or another electrical machine system (not shown). As illustrated, in the embodiment shown, each power converter 310 may output 3-phase power at 4.16 kV at a given frequency (e.g., between 500-1000 Hz) or higher voltage rating for other high speed machine system implementations.

With reference to representative power conversion system 310, incoming power is provided through a circuit breaker system 305 to an input of a given drive enclosure 315. In an example embodiment, such incoming power may be provided at 74 amperes (A). And in an embodiment, each MPBB 315 including a set of slices may output power at 350A. In the high level view illustrated in FIG. 3, each MPBB 315 may include components as discussed above in FIG. 1, including vacuum contactor, TSV diode, at an input to the slices.

As further illustrated, sensors $312_{1A}$ and $312_{1B}$ may be provided, respectively at the input and output of the slices. In an embodiment, such sensors may include 100A and 500 LEM sensors for 13.8 kV/4.16 kV MPBB systems, to provide information regarding operation of the slices and implement system protection and grid connectivity. More specifically, based on sensing information, circuit breaker system 305 coupled at the utility side for grid connectivity can respond to converter commands under system control, to maintain connected or disconnected power converter 310 from grid 302 during normal system operation or during system fault events. Note that in embodiments, sensors such as sensors 312 may be located locally as shown or remotely to provide information including voltage, current and frequency from the power grid side.

In this way, a drive system formed of one or more MPBBs may couple between a grid connection and a high frequency load. For example, the input of the MPBBs may couple to a grid connection that operates at 3-phase at 60 Hz, 13.8 kV and the output of the MPBBs provide(s) output power to a high frequency load that may operate, e.g., at 500 Hz, 4.16 kV and 3-phase. Conversely the MPBB may couple a high frequency generator operating, e.g., at 500 Hz, 4.16 kV 3-phase to a 3-phase grid connection at 60 Hz, 13.8 kV.

In an embodiment, a fiber optic SiC gate driver interface may be implemented to enhance system noise immunity and provide local control signal management. It can be adapted to any commercial or custom-made dual SiC-based device solution. In one embodiment, the interface may be adapted on a circuit board that can be located directly on top of a device gate driver to minimize inductive coupling during signal interfacing. An FPGA chip on-board may be used to locally implement smart features to improve SiC device performance and simplify packaging within this agent. Control and status signal corruption may be mitigated between controller and half bridge gate drivers due to high electrical noise environments of SiC systems. A simplex fiber optic can be used to convey the half bridge switching states and gate driver board control from the controller to the gate driver. A simplex fiber optic can be used to convey fault states and SiC MOSFET temperature from the half bridge gate driver to the controller. An isolated power supply can be used for each half bridge gate driver to minimize ground loops between individual half bridge controls.

Figure 4:
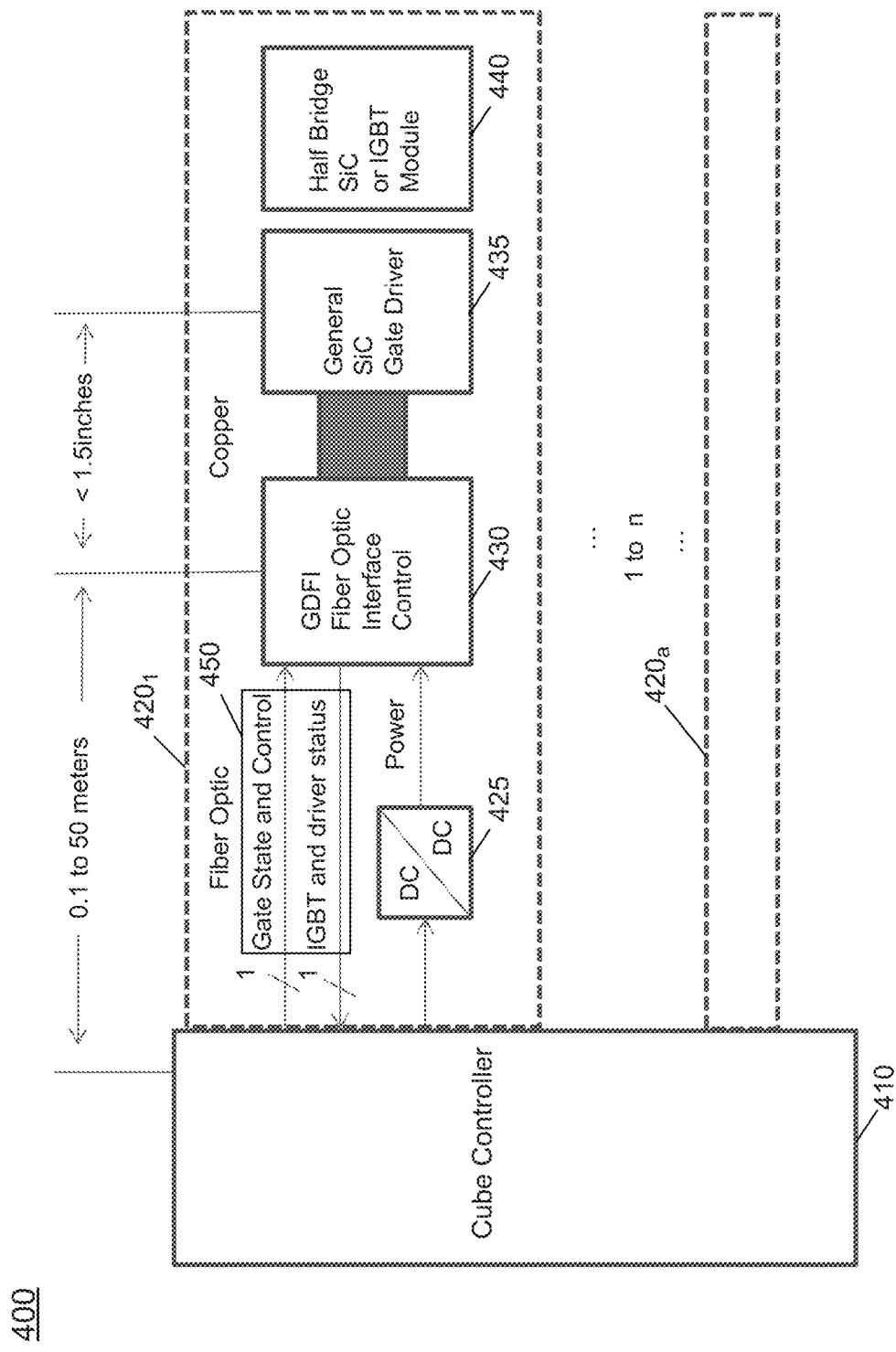
FIG. 4 is a block diagram of an interface circuit in accordance with an embodiment of the present invention.

Referring now to FIG. 4, shown is a block diagram of an interface circuit in accordance with an embodiment of the present invention. More specifically as shown in FIG. 4, interface circuit 400 may be implemented with a fiber optic SiC gate driver interface to provide control to the various switching components of a slice as described herein.

As illustrated, interface circuit 400 includes a cube controller 410 that may generate various control and switching signals, e.g., based on feedback status information as well as control information received from a higher level controller (such as a slice controller, not shown for ease of illustration in FIG. 4). Cube controller 410 is shown to couple to a plurality of interfaces $420_1$-$420_n$. As seen with regard to representative interface $420_1$, included is a DC/DC power supply 425 that provides power to a gate drive fiber interface (GDFI) fiber optic interface controller 430, in turn coupled to a general SiC gate driver 435. Such gate driver may in turn couple to a half bridge SiC or IGBT module 440. Note that SiCs/IGBTs are not themselves present on an interface 420 and they are coupled below interface board and directly on a cold plate, as described further below. As illustrated, cube controller 410 may communicate fiber optically various information including gate state and control signals with controller 430. Also via fiber optic communication, IGBT and driver status may be communicated back to cube controller 410 (collectively, these bi-directional signals are shown as signals 450). Copper interconnects may be used to provide communication between controller 430 and gate driver 435.

Although embodiments are not limited in this regard, by using fiber optic communication, a distance of between approximately 0.1-50 meters can be realized between cube controller 410 and interface controllers 430. And with copper coupling between interface controllers 430 and gate drivers 435, a relatively small distance may be maintained (e.g., 1.5 inches).

Embodiments may provide cooling of transformers and inverters in different manners. In some cases, both sections as implemented in a given slice cabinet may be air cooled. And one or more of the transformer and inverter sections may be liquid cooled by way of a two-phase cooling system.

In various embodiments, power transformer cooling constructions may provide for improved heat rejection. Transformer and power cubes can be through air cooled to enhance heat rejection transfer (taking advantage of mechanical barriers). Whether the overall cooling is air or liquid cooling, understand that internal power cube cooling of main semiconductor (i.e., all SiCs and IGBTs) components can be done using 2-phase cooling.

Figure 5:
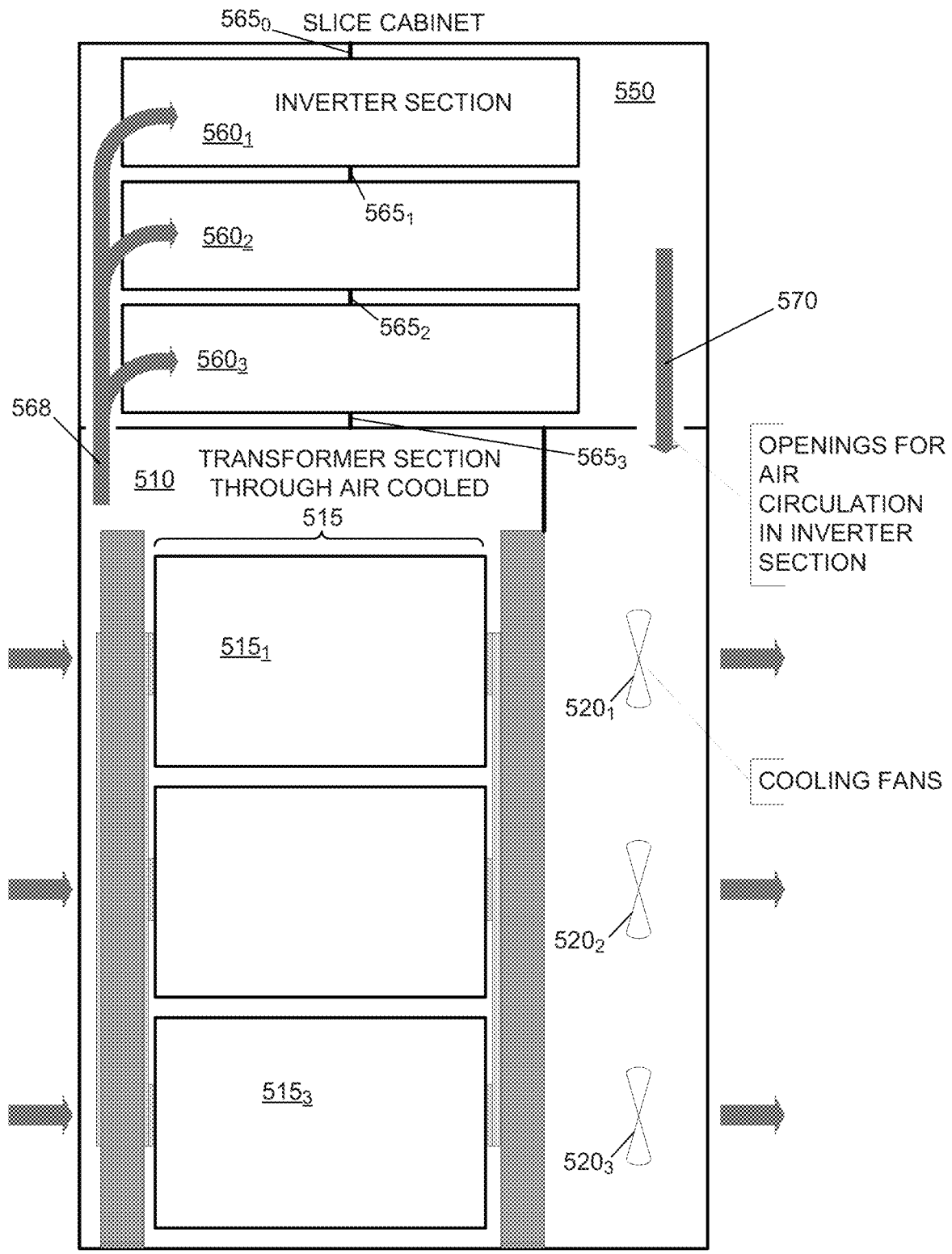
FIG. 5 is a side view of a power conversion cabinet in accordance with an embodiment.

Referring now to FIG. 5, shown is a side view of a power conversion cabinet in accordance with an embodiment. Note that cabinet 500 is a slice cabinet (having a single transformer and 3 power cubes). Understand that in an embodiment, a MPBB is made with 3 cabinet slices as defined in FIG. 2. As illustrated in the cross-sectional view of FIG. 5, cabinet 500 includes a transformer section 510 and an inverter section 550. As illustrated, transformer section 510 includes a transformer 515 having multiple transformer legs $515_1$-$515_3$. In this design, incoming air may be received, e.g., via a grill or other permeable member on a front portion of cabinet 500. As seen, incoming airflow is directed through transformer legs 515 by way of a plurality of cooling fans $520_1$-$520_3$, which exhaust air through the back of cabinet 500. A mechanical barrier to separate cube and transformer sections may be implemented as a horizontal barrier formed of GPO-3 polyester material. This barrier has openings at 568 and 570 as shown.

In turn, additional air is directed from transformer section 510 to inverter section 550 via one or more openings 568, where it passes through a plurality of power cubes $560_1$-$560_3$. Note that in embodiments, mechanical barriers $565_0$-$565_3$, e.g., formed of GPO-3 polyester material, force air flow from opening 568 to pass through power cubes $560_1$-$560_3$ for proper system cooling action. In this way, each power cube receives a direction of fresh air for cooling, which is then exhausted from a rear of cubes 560 and downwardly through one or more openings 570 back into transformer section 510. Via these mechanisms, air circulation is provided, where this air is directed out via fans 520. As such, transformer legs 515 and power cubes 560 receive fresh air from outside and air is exhausted at the back of the cabinet.

Figure 6:
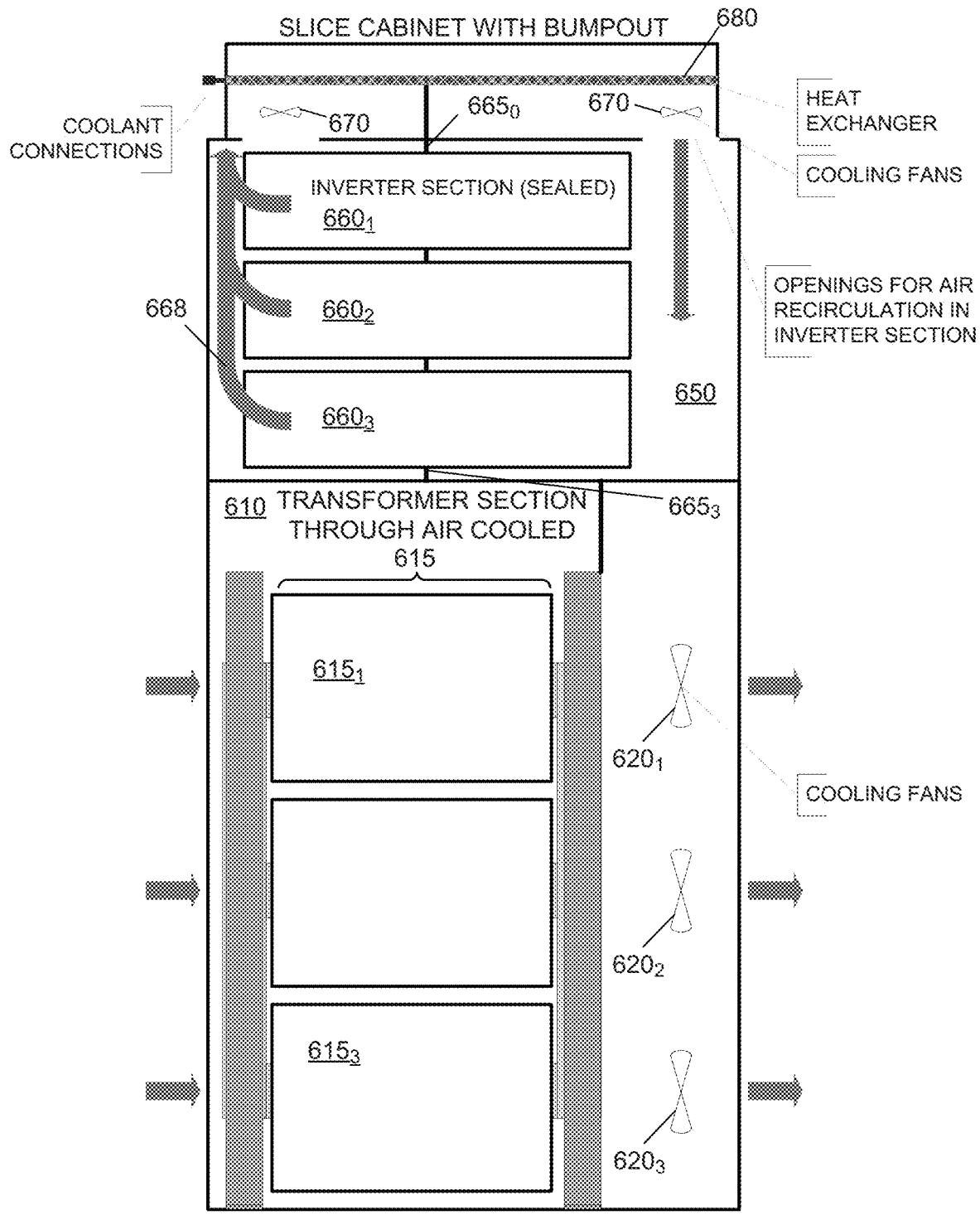
FIG. 6 is a side view diagram of a power conversion cabinet in accordance with another embodiment.

Referring now to FIG. 6, shown is a side view diagram of a power conversion cabinet in accordance with another embodiment. As illustrated in the cross-sectional view of FIG. 6, cabinet 600 includes a transformer section 610 and an inverter section 650. As illustrated, transformer 615 has multiple transformer legs $615_1$-$615_3$. In this design, incoming air may be received, e.g., via a grill on a front portion of cabinet 600. As seen, incoming airflow is directed through transformers legs 615 by way of a plurality of cooling fans $620_1$-$620_3$, which exhaust air through the back of cabinet 600. As illustrated in FIG. 6, transformer section 610 may be air cooled in the same manner as discussed above with regard to FIG. 5. However, in contrast to the FIG. 5 embodiment, FIG. 6 provides an arrangement in which inverter section 650 is liquid cooled. As such, inverter section 650 may remain sealed with respect to transformer section 610, such that there is no air exchange with transformer section 610.

As further illustrated, cooling for inverter section 650 may be provided via a cooling section 680, which provides a flow of liquid coolant for inverter section 650 using 2-phase cooling in a sealed fashion. To enhance power cube heat rejection, the 2-phase liquid can be circulated through a heat exchanger coupled externally to cabinet 600. With cooling fans 670 provided within inverter section 650, air may recirculate throughout inverter section 650. In some embodiments, to realize this capability for liquid cooling within inverter section 650, an extended cabinet with a bumpout section may be provided. Barriers $665_0$-$665_3$ further direct the cooling air flow produced by cooling fans 670 through power cubes $660_1$-$660_3$.

Figure 7:
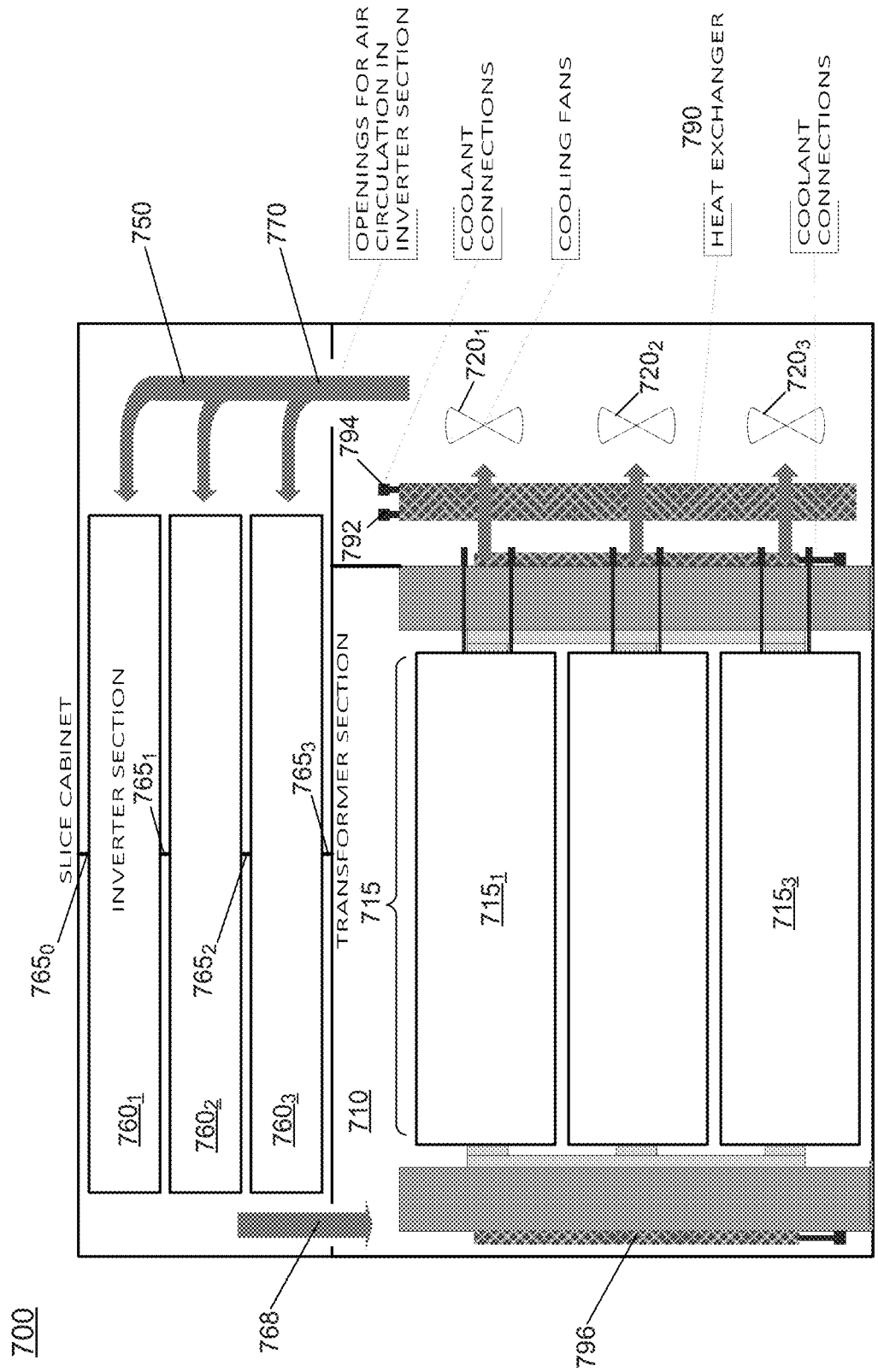
FIG. 7 is a side view of a power conversion cabinet in accordance with yet another embodiment of the present invention.

In yet another embodiment, both transformer and power cubes are 2-phase liquid cooled to maximize slice heat rejection transfer as illustrated in FIG. 7. Referring now to FIG. 7, shown is a side view of a power conversion cabinet in accordance with yet another embodiment. As illustrated in the cross-sectional view of FIG. 7, cabinet 700 includes a transformer section 710 and an inverter section 750. As illustrated, a transformer 715 includes multiple transformer legs $715_1$-$715_3$. Note that cabinet 700 is sealed from external air, but there is an exchange of air between transformer section 710 and inverter section 750 via openings 768 and 770. In an embodiment, a heat exchanger 790 is installed between transformer section 710 and internal fans 720 to keep air circulation through transformer coils and power cubes. In addition to heat exchanger 790, one or more cooling plates can also be located directly on the transformer cores. Thus as illustrated in FIG. 7, cooling plates 796, 798 may be adapted to front and rear portions of transformer 715. As illustrated in the high level view of FIG. 7, heat exchanger 790 may include coolant ports 792, 794 to direct a flow of coolant through heat exchanger 790. Similar cooling of inverter section 750 via a direction of cooled air provided via opening 770 enables corresponding power cubes 760 to be cooled, with heated air flowing back to transformer section 710 via opening 768. Barriers $765_0$-$765_3$ further direct the cooling air flow produced by cooling fans 720 through power cubes 760.

In still other embodiments, additional cooling of a transformer may be realized by providing cold plates located on transformer core faces. In an embodiment, each core leg can be associated with between 2 to 4 cold plates having a width of, e.g., 6 inches. To enhance transformer core heat transfer, additional cold plates can be located on the front and back core transformer faces, namely adapted to the columns of the transformer. Thus in the illustration of FIG. 8A, details of a cooling arrangement for transformers is shown. As illustrated in a side view 810 of FIG. 8A, transformer legs $815_1$-$815_3$ are shown. Cold plates 820 are adapted to front and rear side of transformer columns 811, 812 which includes ports 822, 824 to direct a flow of liquid coolant. In addition, a plurality of cold plates $840_1$-$840_6$ are present. As seen, each cold plate 840 may be installed on top and bottom of core legs and each may include a respective coolant port 842 to provide a flow of liquid coolant. As further illustrated in FIG. 8A, there may be insulation and air channels between different transformer windings and cold plates.

Figure 8A:
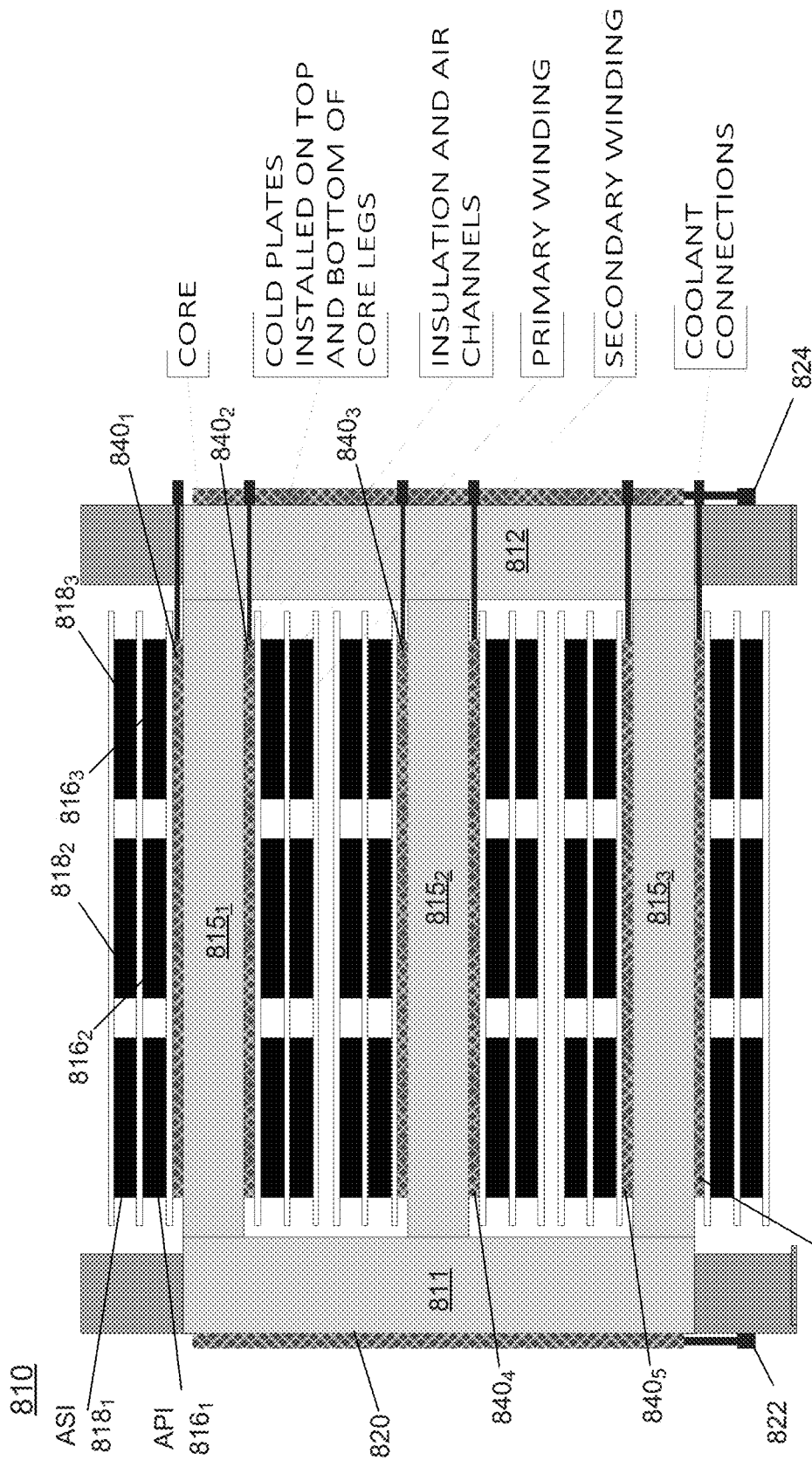
FIG. 8A is a block diagram of details of a cooling arrangement for a transformer in accordance with an embodiment of the present invention.

Still with reference to FIG. 8A, an arrangement of the windings of transformer 815 is illustrated. More specifically, transformer 815 includes a separated winding structure in which multiple separate windings, both primary and secondary, are provided for each transformer leg 815. In the view shown in FIG. 8A, three separated primary windings $816_1$-$816_3$ are illustrated for transformer leg $815_1$. And directly wrapped around each of primary windings 816 is a corresponding one of multiple secondary windings $818_1$-$818_3$. Further details as to this side-by-side or separated winding arrangement are described below.

Figure 8B:
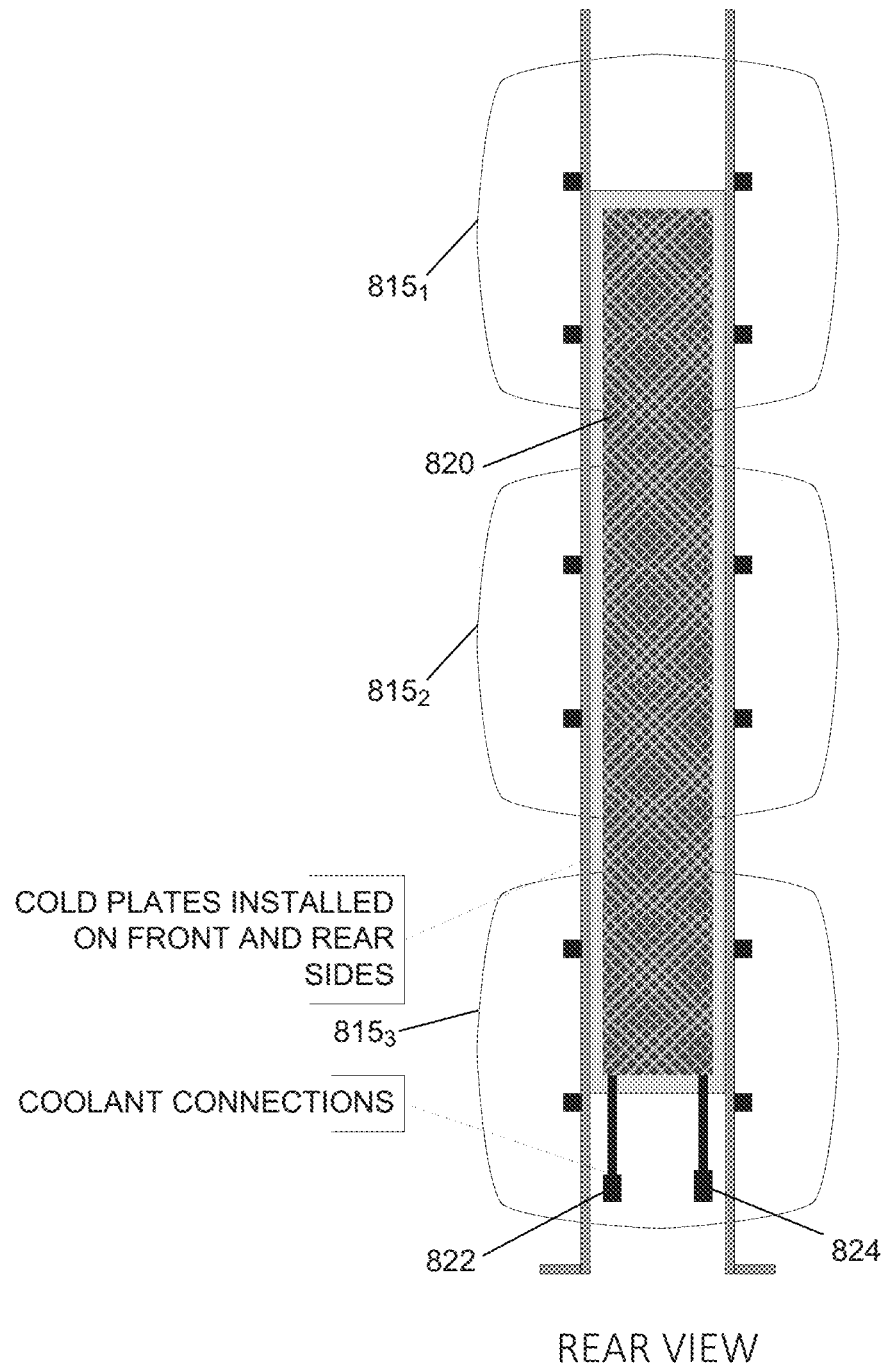
FIG. 8B is a rear view of a transformer that further illustrates a cooling arrangement in accordance with an embodiment of the present invention.
Figure 8C:
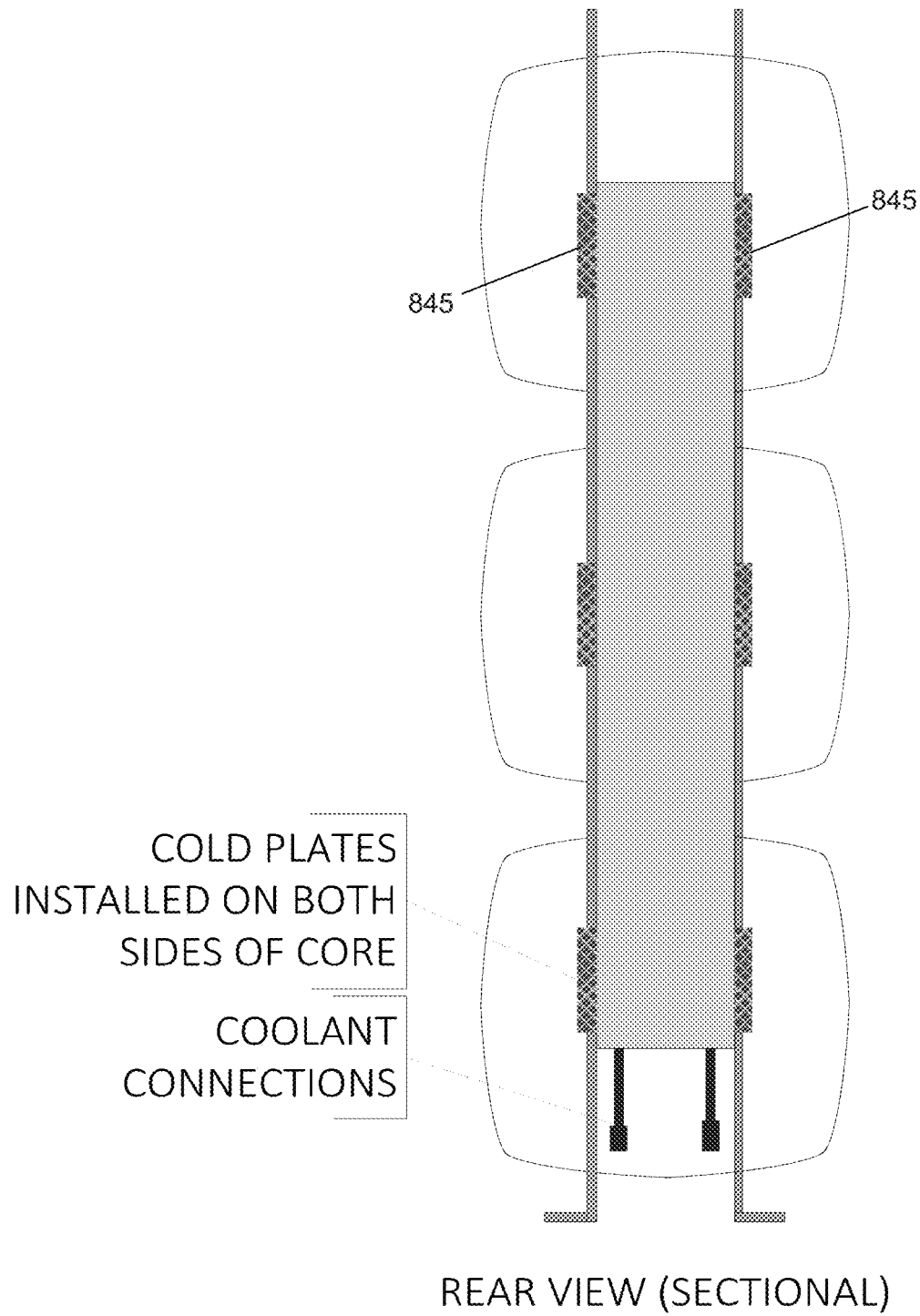
FIG. 8C is a cross-sectional view of a transformer column that further illustrates a cooling arrangement in accordance with an embodiment of the present invention.

FIGS. 8B and 8C further illustrate liquid cooling layouts. Specifically, FIG. 8B shows a rear view of a transformer 815 in which a cold plate 820 is adapted to this rear side of the transformer. Note that a corresponding cold plate also may be installed on the front side of the transformer. Further illustrated are the coolant ports 822, 824. And FIG. 8C shows a cross-sectional view of a transformer column that further illustrates cold plates that may be adapted on corresponding sides of core legs 815. And note with a generally rectangular or square cross section of core legs 815, a cold plate may be located substantially flat or flush with respect to a given face of a core leg. Thus as shown in FIG. 8C, each core leg 815 may have additional corresponding cold plates 845 adapted to their sides.

Figure 8D:
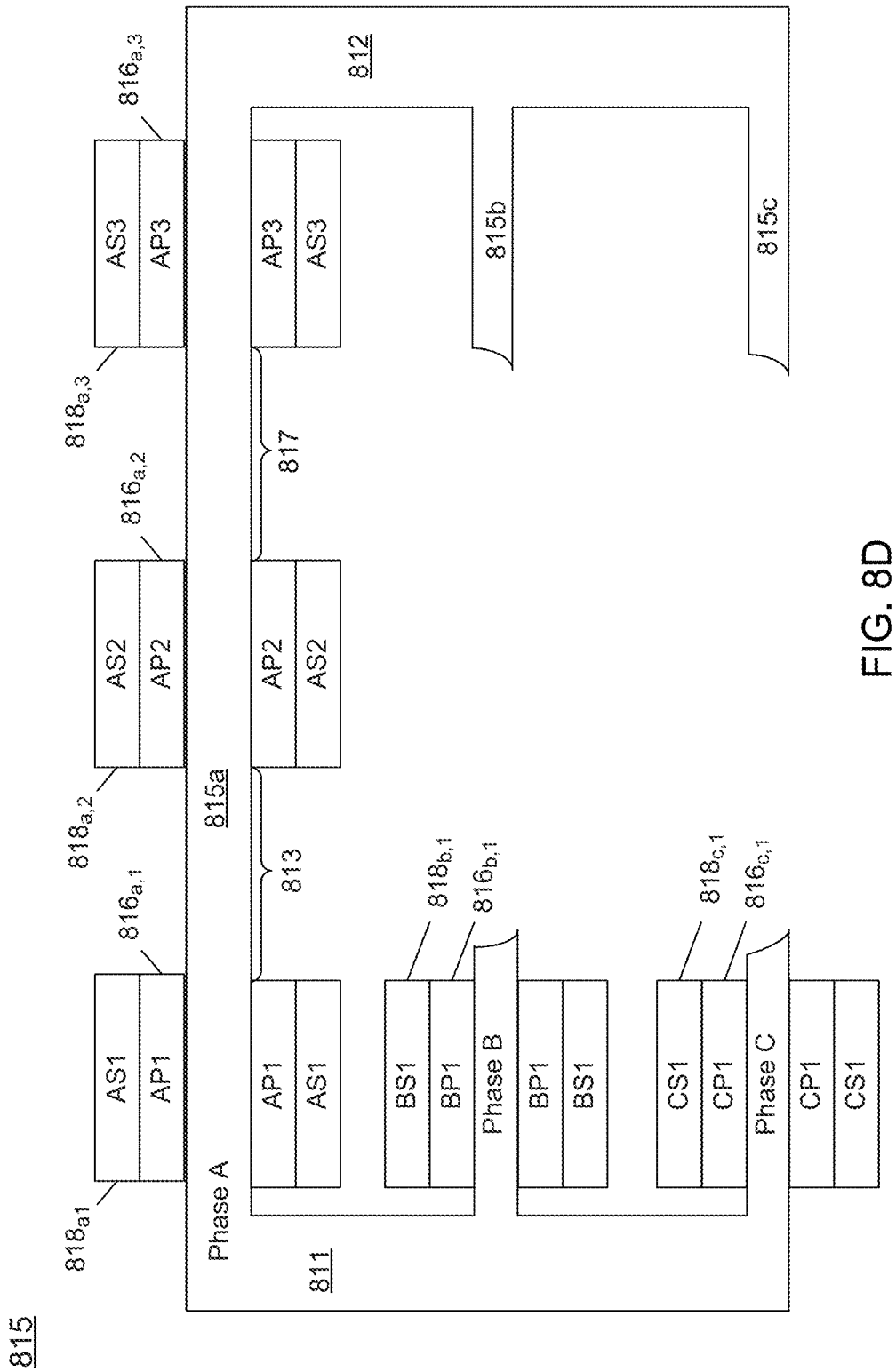
FIG. 8D is an illustration of a transformer in accordance with an embodiment of the present invention.

Referring now to FIG. 8D, shown is an illustration of a transformer in accordance with an embodiment. More specifically, in FIG. 8D, an electrical arrangement of transformer 815 is shown without any cooling structures, so as to not obscure details of the segmented winding configuration. As illustrated, transformer 815 is formed with a plurality of core legs 815a-815c, each coupled between a first column 811 and a second column 813. In an embodiment, core legs 815 and columns 811, 812 may be formed of iron. With a segmented winding structure, in the detailed arrangement of first core leg 815a, which may correspond to a first phase (phase A), a plurality of primary windings $816_{a,1}$-$816_{a,3}$ are present, which are wrapped around core leg 815a. Note of course that with a cooling arrangement herein, cooling plates may be interposed between the core leg and these primary windings.

And as further illustrated, corresponding secondary windings $818_{a,1}$-$818_{a,3}$ wrap directly around the corresponding primary windings. The separation between primary windings and secondary windings determines the equivalent inductance per phase at the secondary side of transformer 815. The recommended value of leakage inductance to aid control stability of each AFE power stage is achieved by implementing a minimum separation between the windings. In other words, there may be a minimum corresponding separation distance between the wrapped primary and secondary windings. For example, there may be a spacing of at least a half inch between a primary winding 816 and a corresponding secondary winding 818.

In an embodiment, a corresponding separation distance 813, 817 may be adapted between the segmented sets of windings. By providing these segmented sets of windings and corresponding separation distances, balanced secondary impedances can be realized. The impedance balanced effect per phase is achieved by creating a decoupling magnetic effect between sets of windings 816 and 818. This magnetic effect is implemented by setting a minimum horizontal separation of two inches between adjacent sets of windings 816 and 818. Note that corresponding sets of primary and secondary windings $816_{b,1-3}$, $818_{b,1-3}$ and $816_{c,1-3}$, $818_{c,1-3}$ are provided for transformer legs 815b,c of second and third phases (which are shown in limited form in FIG. 8D).

Figure 8E:
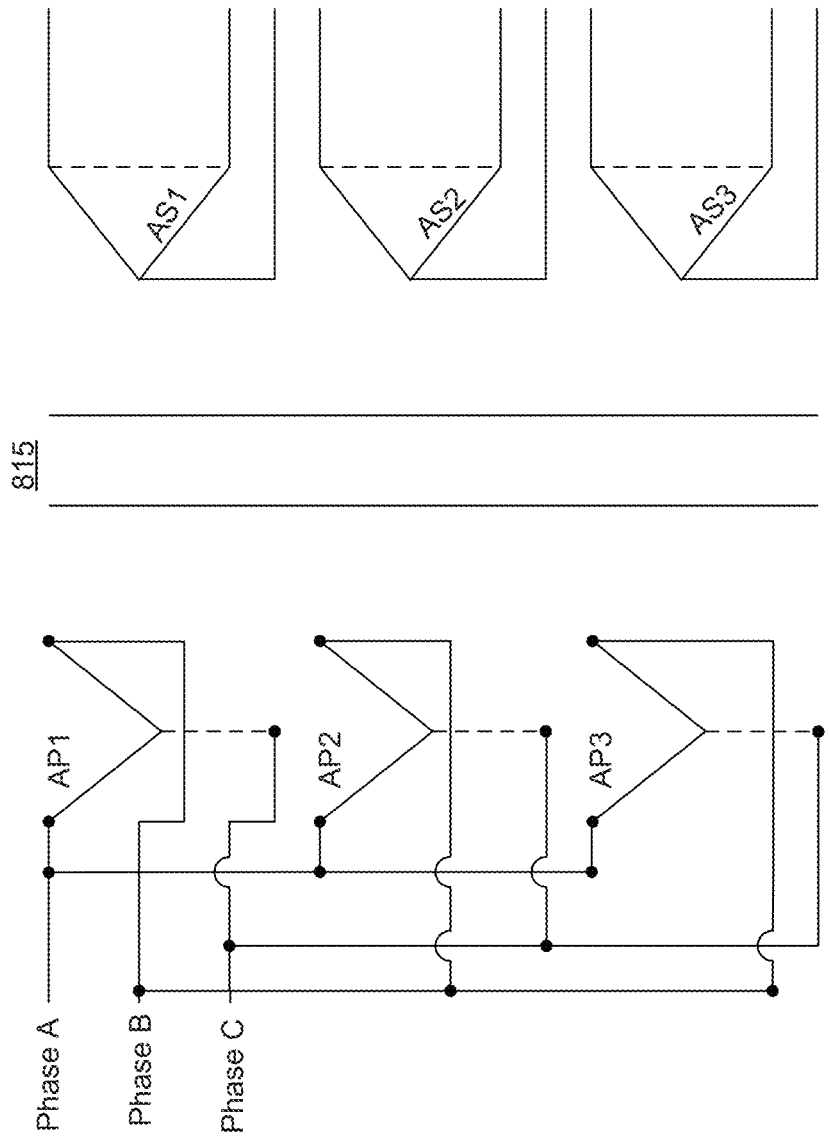
FIG. 8E is a schematic diagram of transformer connections in accordance with an embodiment of the present invention.

With reference now to FIG. 8E, illustrated is a schematic diagram correlating the segmented windings of FIG. 8D to the corresponding connections of each of a plurality of power cubes of a given slice. As illustrated, the corresponding primary windings of a given transformer leg (namely at the same phase) couple to a same phase of input power. And similarly, the corresponding secondary windings of a given phase leg couple in a DELTA configuration to one of a corresponding power cubes (not shown for ease of illustration in FIG. 8E) of a given slice. Note the additional reference marks for primary and secondary windings in FIGS. 8D and 8E show the correspondence between primary and secondary windings for a first phase (AP1-AP3 and AS1-AS3) as adapted around a transformer leg and in the schematic diagram of FIG. 8E. Thus with an arrangement as in FIG. 8E, a transformer is adapted with three WYE configuration in parallel on the primary windings and three isolated DELTA configuration at the secondary of the transformer.

Figure 9:
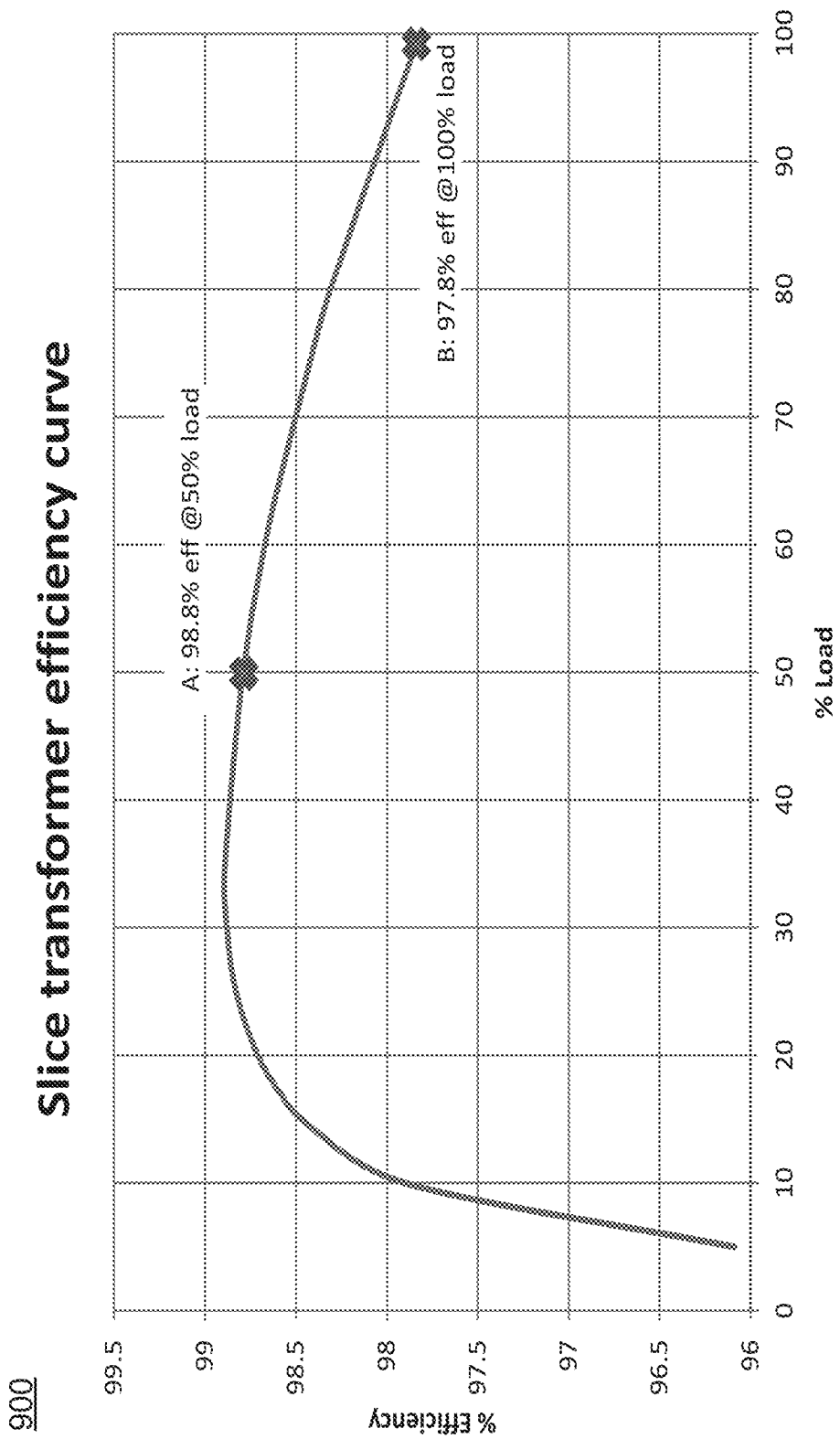
FIG. 9 is a graphical illustration diagram of a slice transformer efficiency curve in accordance with an embodiment of the present invention.

Thus with this arrangement, embodiments provide a high efficiency power transformer design with balanced secondary impedances. There are three parallel primary windings for each secondary winding. Side-by-side arrangement of windings reduces coupling between secondary windings and also increases equivalent impedance seen by the converter. This eliminates the need for extra series inductance per phase inserted at the transformer primary or secondary to ensure converter control stability. It also eliminates the need for any additional filters at the converter input. For Si-based device systems, the need for extra inductance may be allowed as the converter's AFE is switched at low frequency to maintain the overall loss content low. The transformer is designed such as it can be operated at A and B points as demonstrated by the efficiency curve of FIG. 9. In an embodiment, the transformer rating is in the range of 750 kVA and 1000 kVA for a slice system configuration. For balanced impedances, windings are wound in side-by-side arrangement.

Figure 10:
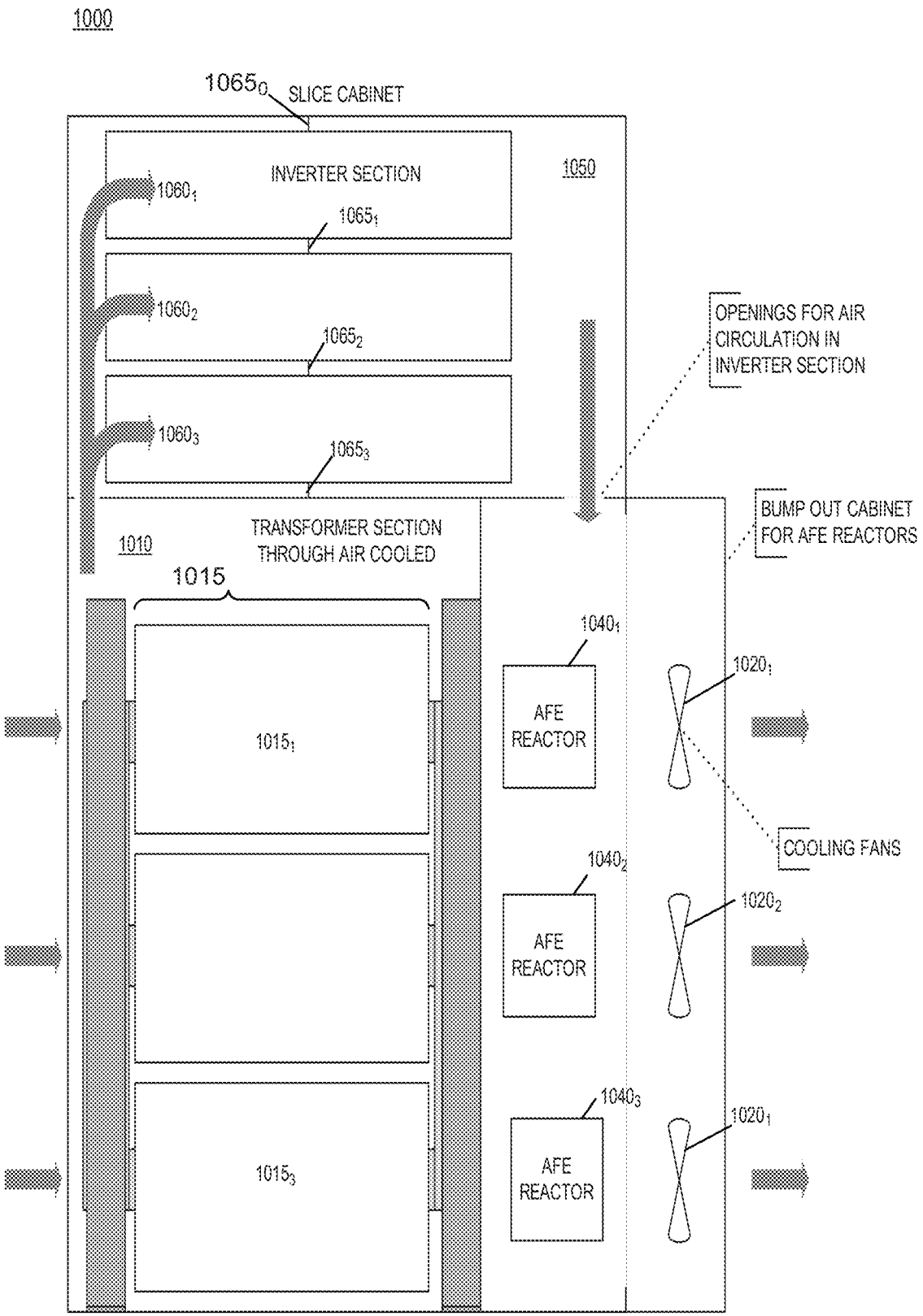
FIG. 10 is a graphical illustration of a slice arrangement in accordance with another embodiment of the present invention

Referring now to FIG. 10, shown is a block diagram of a slice arrangement in accordance with another embodiment of the present invention. More specifically, in the embodiment of FIG. 10, a slice is further provided with additional inductance for active front end devices by way of reactors. As illustrated, in FIG. 10, a slice cabinet 1000 includes a transformer section 1010 and an inverter section 1050. In the illustration shown, an arrangement with air cooled transformer and inverter sections is provided. In addition (and by way of comparison to the arrangement shown in FIG. 5), within transformer section 1010, a plurality of AFE reactors $1040_1$-$1040_3$ are provided. By way of these AFE reactors, a construction is realized that accommodates extra inductance for Si device-based designs. The required inductance may be in the range of 5% and the switching frequency is kept within the range of 2-3 kHz. The AFE reactors are connector in series (per phase) between each secondary DELTA and corresponding cube AFE converter input line.

Embodiments may further provide for efficiencies in configuration of a power cube that implements SiC-based switching devices. Specifically, in an embodiment a laminated DC bus bar design may be used to enhance WBG device performance. This design may minimize the parasitic inductance to less than 13 nH for better SiC device switching performance. The design improves cube switching and short circuit protection by minimizing the total equivalent loop inductance seen during SiC device switching. In a preferred implementation a full SiC device topology may be used with a specific SiC power module terminal layout.

In another implementation a hybrid device cube topology (e.g., Si IGBT-based rectifier and SiC MOSFET-based inverter) may be present that utilizes the same DC bus inductance minimization concept. Understand that other SiC device packages with different power terminal layouts may be also utilized.

Figure 11:
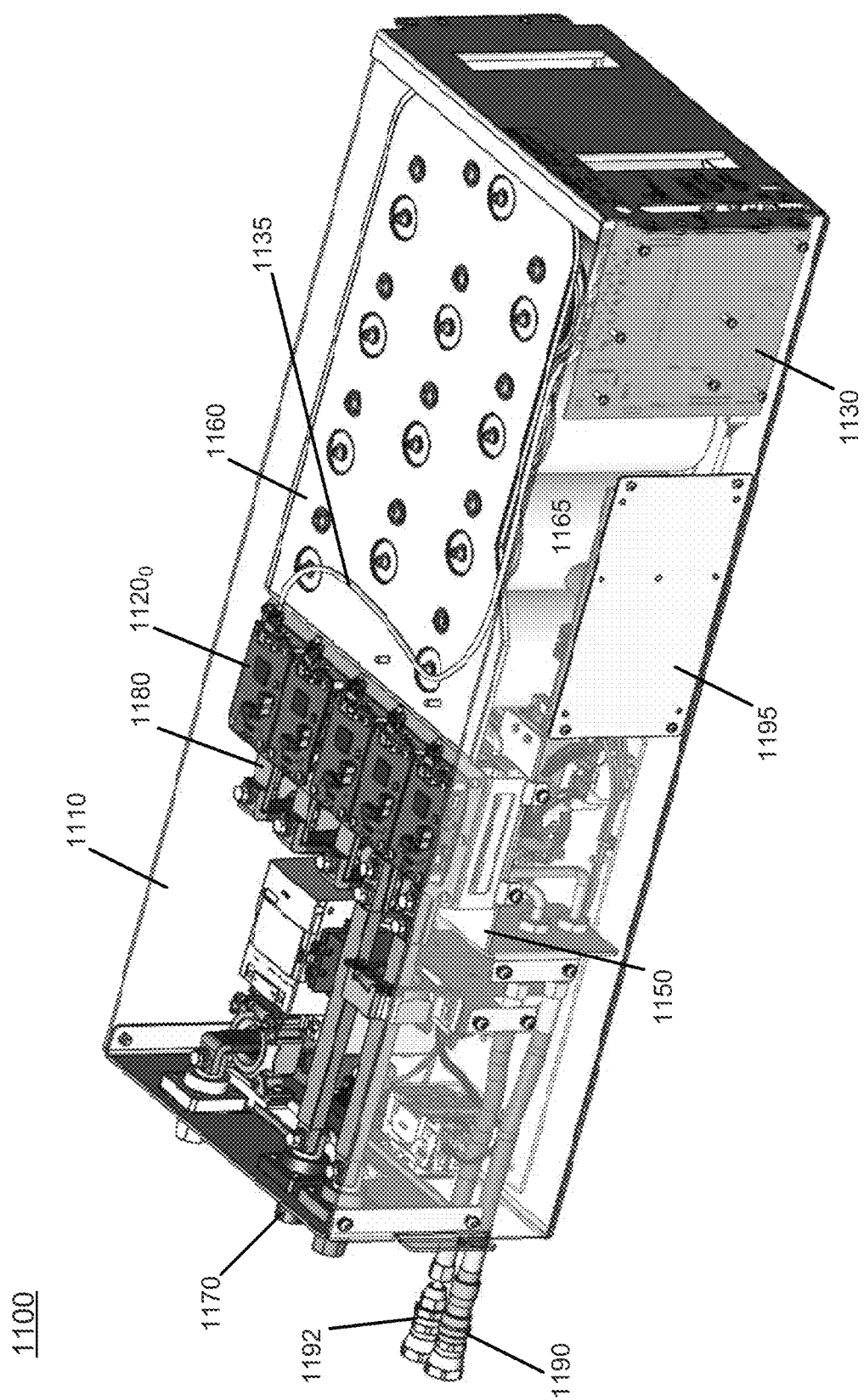
FIG. 11 is a graphical illustration of a full SiC-based power cube in accordance with an embodiment.

As illustrated in FIG. 11, shown is a graphical illustration of a full SiC-based power cube in accordance with an embodiment. As seen, power cube 1100 is implemented in an enclosure 1110. Incoming three-phase power as received from a transformer secondary is provided via a plurality of input AC bus bars 1180. In an embodiment, three such input bus bars are provided to couple incoming three-phase power to corresponding front end SiCs. As shown in FIG. 11, AC bus bars 1180 are displaced towards a rear portion of power cube 1100 for improving heat rejection relief. This is so, since with this placement of AC bus bars 1180, bus bar design is simplified in that they can be fabricated with a shorter length and their heat rejection bulk is not concentrated over the SiC devices or under a DC bus bar. Thus in the embodiment shown, bus bars 1180 may couple to SiCs of a front end stage (details of which are not shown in FIG. 11). Note that the switching of the SiC devices may be controlled by fiber optic SiC gate driver interfaces $1120_0$-$1120_n$. While 5 such driver interfaces are shown in the embodiment of FIG. 11, different numbers may be present in other embodiments. For non-regenerative applications, a passive front end rectifier may include dual diode power modules, therefore only two switches are controlled (inverter side), thus, only 2 driver interfaces are used. Hybrid and full SiC topologies use 5 controlled switches each (SiC MOSFET and/or IGBTs), therefore 5 driver interfaces are needed. If there are parallel SiC devices, a maximum of 10 driver interfaces may be needed. Control signals are provided to driver interfaces 1120 via a SiC based control board 1130 that couples to interfaces 1120 via corresponding fiber optic interconnects 1135. As further illustrated in FIG. 11, driver interfaces 1120 are adapted above SiC modules themself which in turn are configured on a cold plate assembly 1150. Note that power may be provided to various control and monitoring circuitry via a power supply 1195.

As further illustrated, at a forward portion of enclosure 1110, a DC link is formed with a DC bus 1160, details of which are described below. The DC link further includes, in addition to DC bus 1160 itself, a plurality of capacitors 1165 coupled thereto, a representative one of which is identified in FIG. 11. In an embodiment, power cube 1100 may be implemented with DC bus 1160 coupled to capacitors 1165 having an optimized sizing. In a particular embodiment, a given power cube may be implemented with a capacitance of between approximately 7.6-11.4 millifarads (mF) for better transient and power transfer performance.

Still with reference to FIG. 11, output power may be output from power cube 1100 via a plurality of output bus bars 1170, which as shown couple to corresponding ones of AC bus bars 1180.

To provide for cooling of SiCs and other components within power cube 1100, conduits 1190, 1192 may be provided to direct a flow of cooling liquid or other cooling media. Understand while shown at this high level in the embodiment of FIG. 11, many variations and alternatives are possible.

Embodiments provide a DC bus construction that improves SiC device clearance. More particularly, a DC bus may be designed to mechanically decouple the DC bus from AC bus bars; further allowing construction of AC bus bars to be simplified as described above. In this way, device terminal clearances can be increased (e.g., from 2 mils to 5 mils). And with an electrical insulation improvement, the DC link bus can operate between 1000-1200 VDC in an example embodiment.

Figure 12:
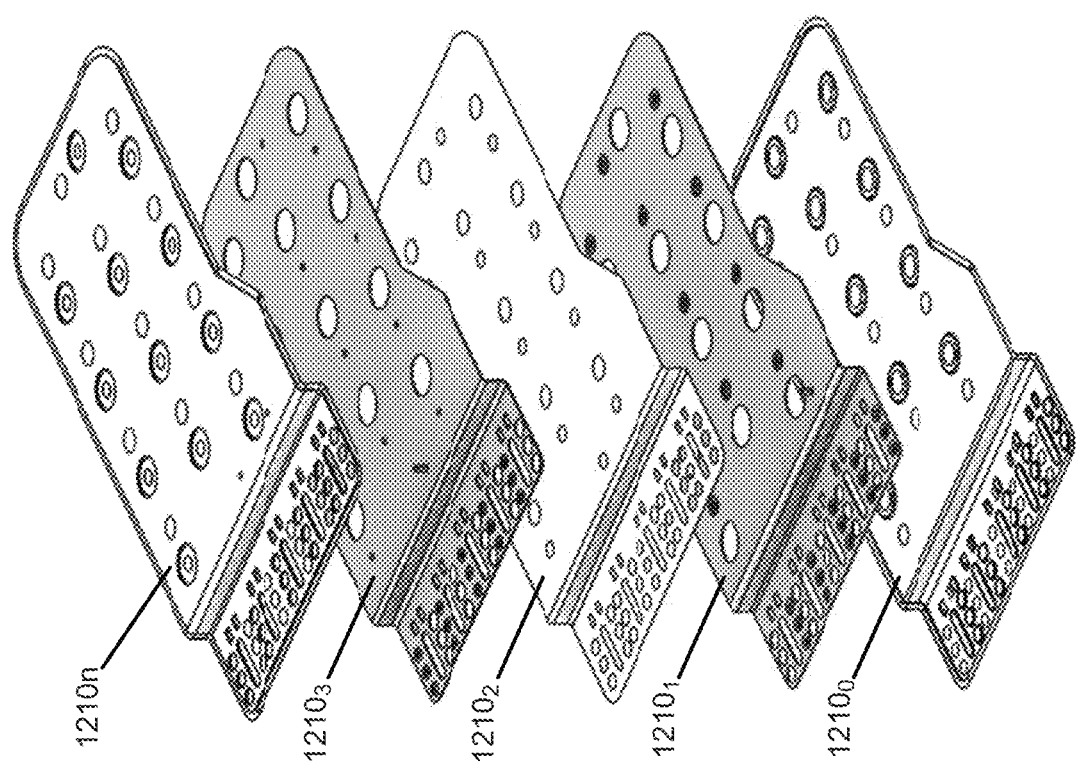
FIG. 12 is a graphical illustration of a DC bus arrangement in accordance with an embodiment.
Figure 12:
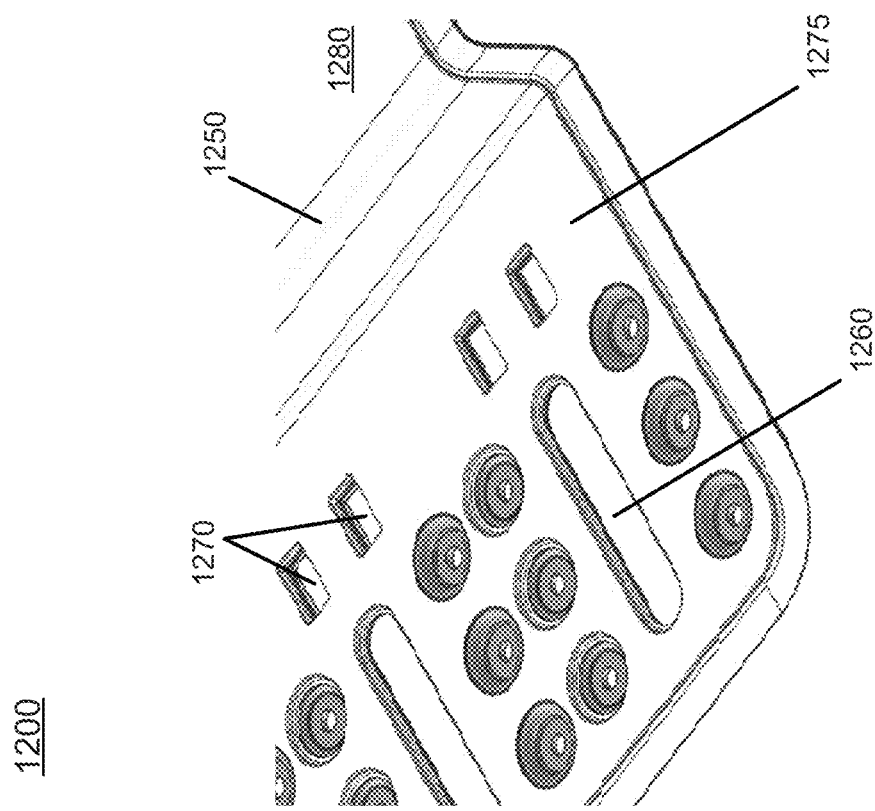

Referring now to FIG. 12, shown is a graphical illustration of a DC bus arrangement in accordance with an embodiment. As shown in FIG. 12, DC bus 1200 may be implemented via a laminated construction including a plurality of layers $1210_0$-$1210_n$. In the particular embodiment shown, a five layer arrangement is realized, however more or fewer layers may be present in a particular embodiment. As illustrated, DC bus 1200 is implemented with alternating layers of conductive and insulative material. More specifically, negative and positive DC bus layers $1210_1$, $1210_3$, respectively couple between corresponding insulation layers $1210_0$, $1210_2$ and $1210_n$. In an embodiment, DC bus layers $1210_1$, $1210_3$ may be implemented with a given conductive material, e.g., copper, and may have an approximate thicknesses of 50-100 mils. In turn, insulation layers $1210_0$, $1210_2$, $1210_n$, may be implemented with an insulative material, e.g., PET insulation materials. In a given embodiment, insulation layers $1210_0$, $1210_n$ may be configured with a thickness of between approximately 5-10 mils, and insulation layer $1210_2$ may be adapted with an insulative material of layer between 5-20 mils thick.

As further shown in inset 1250 of FIG. 12 with the raised arrangement of the DC bus 1200, including a first horizontal portion 1275 and a second raised horizontal portion 1280, a mechanical decoupling of AC bus bars from the DC link is realized. Also as shown the formed DC bus provides a plurality of clearances, including representative clearances 1260 and 1270 on first horizontal portion 1275. More specifically, clearances 1260 provide an AC bus clearance. Via clearance 1260, an AC bus bar can be torqued to an SiC device. In turn, second horizontal portion 1280 may provide for connection to the capacitors of DC link.

Via clearances 1270, gate driver connections may be made. Via this location of clearances 1270, DC bus copper area may be maximized and AC bus bar design can be simplified. That is, the AC bus bars can be located in a straight fashion from the back of the power converter. This allows the reduction of copper (smaller AC buses) and packaging simplification (small physical space). In one embodiment, the positive and negative SiC device connection to the DC laminated bus is achieved by using three embossed circles set at each side of clearances 1260. To improve DC bus terminal creepage distances, other SiC device terminal shape openings can be used as opposed to embossed circle sets. With this laminated configuration including first horizontal portion 1275 having gate drive openings directly through the DC bus, decoupling of AC bus bars and DC bus bars is made possible.

In another system construction (not shown), insulation around the SiC device terminals is maximized by uniting clearances 1270 and 1260 in a single opening on an insulation layer to increase clearances over 5 mils without a significant increase on system loop inductance. The same procedure can be performed on the negative copper plate $1210_3$.

Figure 13:
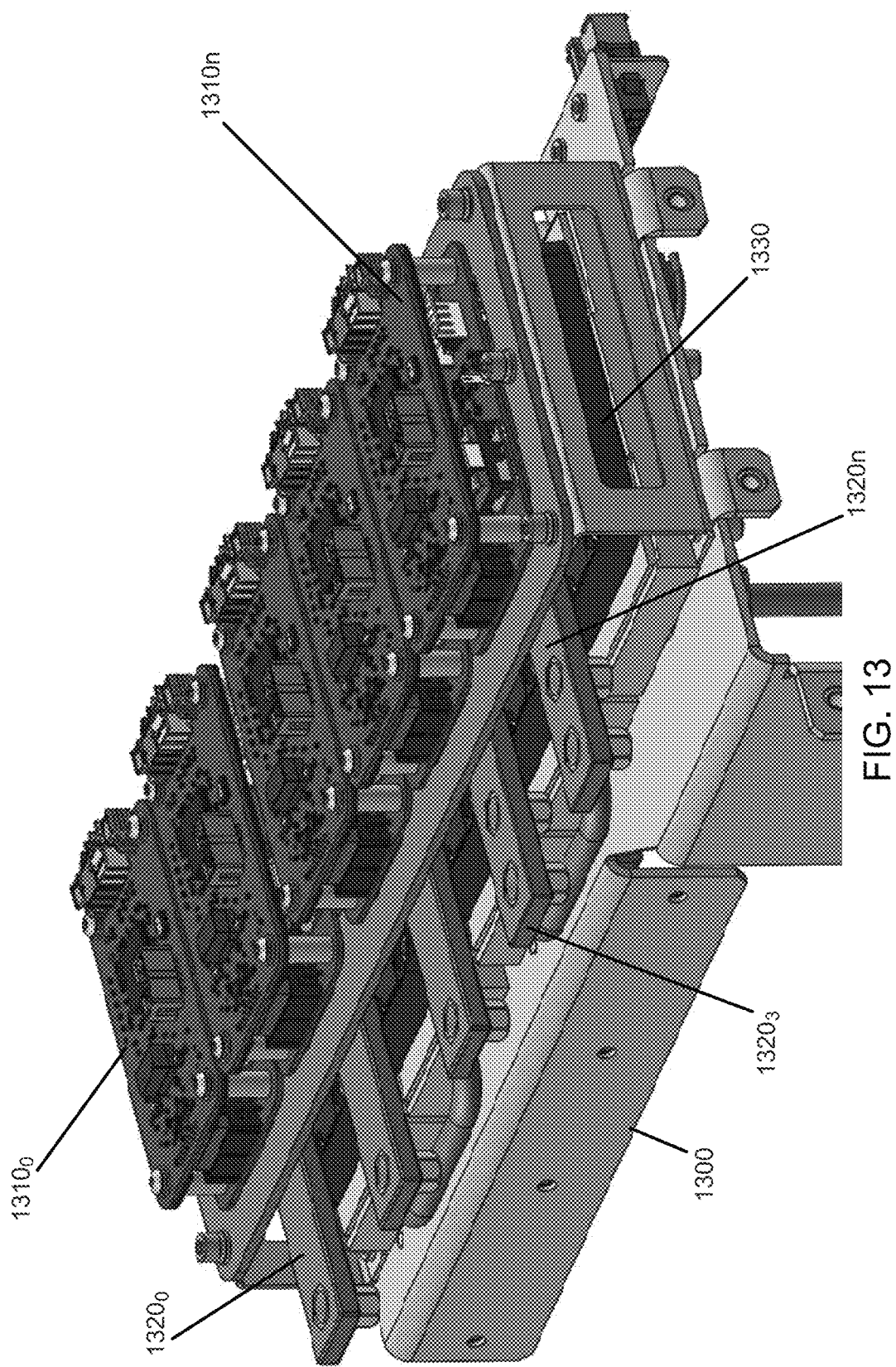
FIG. 13 is an arrangement having decoupled AC and DC buses in accordance with an embodiment.

Referring now to FIG. 13, shown is an arrangement having decoupled AC and DC buses. More specifically as illustrated in FIG. 13, a cold plate 1300 assembly is provided on which a plurality of gate drivers interfaces $1310_0$-$1310_n$ are present. As discussed above, such driver interfaces provide control signals to gates of SiCs or other switching devices 1330 adapted below the gate driver boards (and which are coupled to cold plate assembly 1300). As further illustrated, extending from switching devices 1330 are a plurality of AC bus bars $1320_0$-$1320_n$. While 5 such AC bus bars are shown, more or fewer may be present in a particular embodiment. With this arrangement, AC bus bars 1320 may be decoupled from a DC bus (not shown in FIG. 13), but understand that such DC bus is adapted to a rear of cold plate assembly 1300 (while AC bus bars 1320 extend from a forward portion of cold plate assembly 1300). In this way, AC bus bars 1320 provide an improved power cube packaging. Note that output bus bar cube connections (not shown in FIG. 13) may couple to AC bus bars $1320_3$, $1320_g$.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A medium voltage power converter comprising:
    a cabinet comprising:
        a power cube bay to house a plurality of power cubes, each of the plurality of power cubes adapted within a corresponding enclosure and comprising a low frequency front end stage, a DC link and a high frequency back end stage, the plurality of power cubes to couple to a high speed machine; and
        a plurality of first barriers adapted to isolate and direct a first flow of cooling air through one of the plurality of power cubes; and
        a transformer bay having at least one transformer to couple between a utility connection and the plurality of power cubes, the transformer bay including a plurality of cooling fans to cool the at least one transformer.

2. The medium voltage power converter of claim 1, wherein the cabinet includes at least one first opening to divert the first flow of cooling air from the transformer bay to the power cube bay and at least one second opening to direct a flow of air exiting the plurality of power cubes from the power cube bay to the transformer bay.

3. The medium voltage power converter of claim 2, wherein the plurality of cooling fans is to exhaust the exiting flow of air.

4. The medium voltage power converter of claim 1, wherein the cabinet comprises a permeable member to enable a second flow of cooling air from an ambient environment to be directed through the at least one transformer via the plurality of cooling fans.

5. The medium voltage power converter of claim 1, wherein the cabinet comprises a sealed enclosure.

6. The medium voltage power converter of claim 1, wherein the transformer bay is to be air cooled and the power cube bay is to be liquid cooled.

7. The medium voltage power converter of claim 6, wherein the power cube bay is isolated from the transformer bay.

8. The medium voltage power converter of claim 7, wherein the power cube bay comprises:
a heat exchanger to remove heat from the first flow of cooling air;
a first opening to enable the first flow of cooling air to be directed through the plurality of power cubes; and
a second opening to direct a flow of heated air from the plurality of power cubes to the heat exchanger.

9. A system comprising:
a medium voltage power converter comprising:
a first cabinet comprising:
a power cube bay to house a plurality of power cubes, each of the plurality of power cubes adapted within a corresponding enclosure and comprising a low frequency front end stage, a DC link and a high frequency back end stage, the plurality of power cubes to couple to a high speed machine;
a transformer bay having at least one transformer to couple between a utility connection and the plurality of power cubes, the transformer bay including:
a plurality of cooling fans to cool the at least one transformer; and
the at least one transformer comprising:
a plurality of core legs adapted between a first column and a second column, wherein:
a first core leg has a first plurality of cold plates adapted there about, a first set of primary windings adapted around the first plurality of cold plates, and a first set of secondary windings adapted around the first set of primary windings;
a second core leg has a second plurality of cold plates adapted there about, a second set of primary windings adapted around the second plurality of cold plates, and a second set of secondary windings adapted around the second set of primary windings;
a third core leg has a third plurality of cold plates adapted there about, a third set of primary windings adapted around the third plurality of cold plates, and a third set of secondary windings adapted around the third set of primary windings.

10. The system of claim 9, further comprising:
a first cold plate adapted about at least a portion of the first column; and
a second cold plate adapted about at least a portion of the second column.

11. The system of claim 9, wherein the first cabinet is sealed with regard to an ambient environment, wherein at least one first opening is provided between the transformer bay and the power cube bay to provide a first flow of cooling air from the transformer bay to the power cube bay and at least one second opening is provided between the transformer bay and the power cube bay to provide a flow of exhaust air from the power cube bay to the transformer bay.

12. The system of claim 9, further comprising a plurality of first barriers adapted to isolate and direct a first flow of cooling air through one of the plurality of power cubes.

13. The system of claim 9, further comprising a first two-phase cooling system to cool the at least one transformer via the first, second and third plurality of cold plates.

14. The system of claim 13, further comprising a second two-phase cooling system to cool at least the low frequency front end stage and the high frequency back end stage of the plurality of power cubes.

15. An apparatus comprising:
a cabinet including a medium voltage power converter, the cabinet including:
a power cube bay to house a plurality of power cubes, each of the plurality of power cubes adapted within a corresponding enclosure and comprising a front end stage, a DC link and a back end stage;
a plurality of first barriers adapted to isolate and direct a flow of cooling air through one of the plurality of power cubes; and
a transformer bay having at least one transformer to couple between a utility connection and the plurality of power cubes, the transformer bay including:
a plurality of cooling fans to direct the flow of cooling air, the cabinet including at least one first opening to direct the flow of cooling air from the transformer bay to the power cube bay and at least one second opening to direct a flow of air exiting the plurality of power cubes from the power cube bay to the transformer bay.

16. The apparatus of claim 15, further comprising:
a first plurality of cold plates adapted around a first core leg of the at least one transformer, and interposed between the first core leg and a first set of primary windings adapted around the first core leg;
a second plurality of cold plates adapted around a second core leg of the at least one transformer, and interposed between the second core leg and a second set of primary windings adapted around the second core leg; and
a third plurality of cold plates adapted around a third core leg of the at least one transformer, and interposed between the third core leg and a third set of primary windings adapted around the third core leg.

17. The apparatus of claim 16, further comprising:
a first cold plate adapted about at least a portion of a first column of the at least one transformer; and
a second cold plate adapted about at least a portion of a second column of the at least one transformer.

18. The apparatus of claim 16, further comprising a first two-phase cooling system to cool the at least one transformer via the first, second and third plurality of cold plates and a second two-phase cooling system to cool at least the plurality of power cubes.

19. The apparatus of claim 15, wherein the cabinet comprises a sealed enclosure.

20. The apparatus of claim 15, further comprising a plurality of reactors adapted within the transformer bay, each of the plurality of reactors coupled between the at least one transformer and a corresponding one of the plurality of power cubes.

* * * * *